US012604470B2

(12) United States Patent
Choi et al.

(10) Patent No.: US 12,604,470 B2
(45) Date of Patent: Apr. 14, 2026

(54) MEMORY DEVICE AND METHOD OF MANUFACTURING THE SAME

(71) Applicant: SK hynix Inc., Icheon-si (KR)

(72) Inventors: Won Geun Choi, Icheon-si (KR); Mi Seong Park, Icheon-si (KR); Jung Shik Jang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 704 days.

(21) Appl. No.: 17/948,627

(22) Filed: Sep. 20, 2022

(65) Prior Publication Data

US 2023/0320094 A1     Oct. 5, 2023

(30) Foreign Application Priority Data

Mar. 24, 2022     (KR) ........................ 10-2022-0036937

(51) Int. Cl.
| | |
|---|---|
| *H10B 43/27* | (2023.01) |
| *H01L 23/528* | (2006.01) |
| *H10B 41/10* | (2023.01) |
| *H10B 41/27* | (2023.01) |
| *H10B 43/10* | (2023.01) |

(52) U.S. Cl.
CPC ......... *H10B 43/27* (2023.02); *H01L 23/5283* (2013.01); *H10B 41/10* (2023.02); *H10B 41/27* (2023.02); *H10B 43/10* (2023.02)

(58) Field of Classification Search
CPC ................................ H10B 43/10; H10B 41/10
See application file for complete search history.

(56) References Cited

U.S. PATENT DOCUMENTS

| | | | |
|---|---|---|---|
| 10,566,348 B1 | 2/2020 | Yeh et al. | |
| 10,796,952 B1 | 10/2020 | Shen | |
| 2020/0303382 A1 | 9/2020 | Takashima et al. | |
| 2021/0020203 A1* | 1/2021 | Choi ...................... G11C 5/063 | |
| 2022/0068317 A1* | 3/2022 | Fukuzumi .............. H10B 41/27 | |

FOREIGN PATENT DOCUMENTS

| | | |
|---|---|---|
| KR | 1020140018540 A | 2/2014 |
| KR | 1020210010210 A | 1/2021 |

* cited by examiner

*Primary Examiner* — Christopher A Johnson
(74) *Attorney, Agent, or Firm* — WILLIAM PARK AND ASSOCIATES LTD.

(57)     ABSTRACT

A memory device, and a method of manufacturing the same, includes a stack structure and main plugs passing through the stack structure, the main plugs being spaced apart from each other in a first direction. The memory device also includes a separation pattern separating the main plugs in a second direction and a slit pattern separating the stack structure into first and second memory blocks, the slit pattern having an ellipse shape.

15 Claims, 40 Drawing Sheets

MEMORY DEVICE AND METHOD OF MANUFACTURING THE SAME

CROSS-REFERENCE TO RELATED APPLICATION

The present application claims priority under 35 U.S.C. 119(a) to Korean patent application number 10-2022-0036937, filed on Mar. 24, 2022, in the Korean Intellectual Property Office, the entire disclosure of which is incorporated herein by reference.

BACKGROUND

1. Technical Field

The present disclosure relates to a memory device and a method of manufacturing the same, and more particularly, to a three-dimensional memory device and a method of manufacturing the same.

2. Related Art

A memory device may be classified as a volatile memory device, in which stored data is lost when supplied power is interrupted, or a non-volatile memory device, in which stored data is maintained even when supplied power is interrupted.

A non-volatile memory device may include NAND flash memory, NOR flash memory, resistive random access memory (ReRAM), phase-change random access memory (PRAM), magnetoresistive random access memory (MRAM), ferroelectric random access memory (FRAM), spin transfer torque random access memory (STT-RAM), etc.

A NAND flash memory system may include a memory device configured to store data and a controller configured to control the memory device. The memory device may include a memory cell array for storing data, and peripheral circuits configured to perform a program, read, or erase operation in response to a command transmitted from the controller.

The memory cell array may include a plurality of memory blocks, and each of the plurality of memory blocks may include a plurality of memory cells.

As an integration degree of memory devices increases, a memory device capable of storing a large amount of data is required, and simplification of a manufacturing process is required to reduce manufacturing cost.

SUMMARY

An embodiment of the present disclosure is directed to a memory device capable of improving an integration degree, and also a simplified method of manufacturing the memory device.

According to an embodiment of the present disclosure, a memory device includes: a stack structure; main plugs passing through the stack structure and arranged to be spaced apart from each other in a first direction; a separation pattern separating the main plugs in a second direction; and a slit pattern separating the stack structure into first and second memory blocks, the slit pattern having an ellipse shape.

According to an embodiment of the present disclosure, a memory device includes: a stack structure formed on a source line; main plugs passing through the stack structure and arranged to be spaced apart from each other in a first direction; separation patterns separating the main plugs in a second direction; and a slit separating the stack structure into first and second memory blocks, the slit comprising slit patterns having an ellipse shape.

According to an embodiment of the present disclosure, a method of manufacturing a memory device includes: alternately stacking first and second material layers on a lower structure in which a cell area and a connection area are defined; forming main plugs passing through the first and second material layers in the cell area; forming separation holes separating the main plugs into first and second sub-plugs; forming slit holes in the connection area when forming the separation holes; forming separation patterns in the separation holes; removing the second material layers exposed through the slit holes; forming conductive layers between the first material layers where the second material layers are removed; removing a portion of the conductive layers adjacent to the slit holes; forming an insulating layer along a side surface of the slit holes from which the portion of the conductive layers is removed; and forming a source contact in the slit holes in which the insulating layer is formed.

According to the present technology, an integration degree of the memory device may be increased, and a manufacturing step of the memory device may be simplified.

DETAILED DESCRIPTION

Specific structural and functional descriptions of embodiments are disclosed in the present specification or application to teach the concept of the present disclosure. Embodiments according to the concept of the present disclosure may be carried out in various forms and should not be construed as being limited to the specific embodiments described herein.

Figure 1:
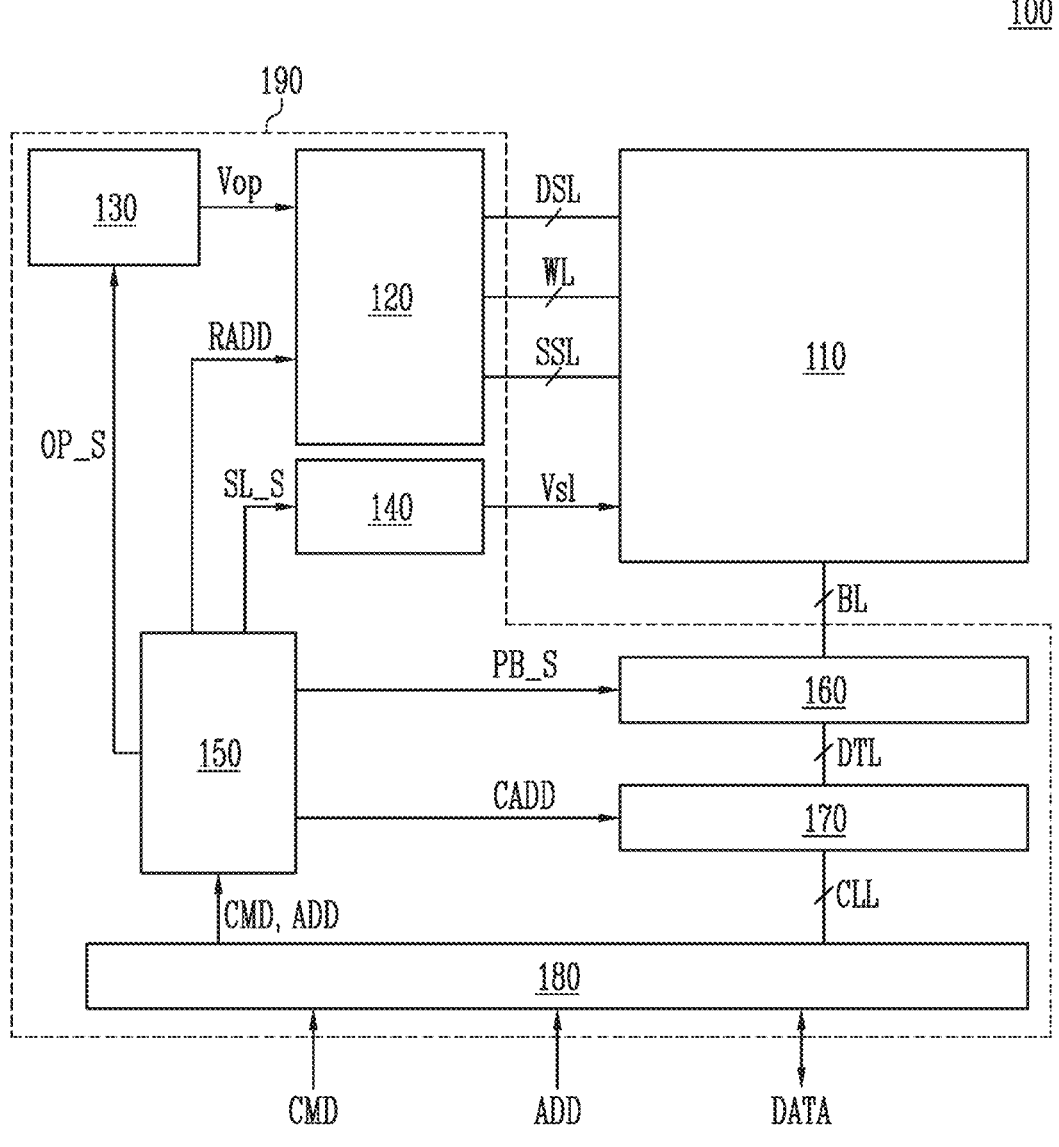
FIG. 1 is a block diagram illustrating a memory device according to an embodiment of the present disclosure.

FIG. 1 is a block diagram illustrating a memory device according to an embodiment of the present disclosure.

Referring to FIG. 1, a memory device 100 may include a peripheral circuit 190 and a memory cell array 110.

The peripheral circuit 190 may be configured to perform a program operation and a verify operation for storing data in the memory cell array 110, a read operation for outputting data stored in the memory cell array 110, or an erase operation for erasing data stored in the memory cell array 110. The peripheral circuit 190 may include a voltage generating circuit 130, a row decoder 120, a source line driver 140, a control circuit 150, a page buffer 160, a column decoder 170, and an input-output circuit 180.

The memory cell array 110 may include a plurality of memory cells in which data is stored. As an embodiment, the memory cell array 110 may include a three-dimensional memory cell array. The plurality of memory cells may store single-bit or multi-bit data of two or more bits according to a program method. The plurality of memory cells may configure a plurality of strings. The memory cells included in each of the strings may be electrically connected to each other through a channel. Channels included in the strings may be connected to the page buffer 160 through bit lines BL.

The voltage generating circuit 130 may generate various operation voltages Vop used for the program operation, the read operation, or the erase operation in response to an operation signal OP_S. For example, the voltage generating circuit 130 may be configured to selectively generate and output the operation voltages Vop including a program voltage, a verify voltage, a pass voltage, a read voltage, an erase voltage, and the like.

The row decoder 120 may be connected to the memory cell array 110 through a plurality of drain selection lines DSL, a plurality of word lines WL, and a plurality of source selection lines SSL. The row decoder 120 may transmit the operation voltages Vop to the plurality of drain selection lines DSL, the plurality of word lines WL, and the plurality of source selection lines SSL in response to a row address RADD.

The source line driver 140 may transmit a source voltage Vsl to the memory cell array 110 in response to a source line control signal SL_S. For example, the source voltage Vsl may be transmitted to a source line connected to the memory cell array.

The control circuit 150 may output the operation signal OP_S, the row address RADD, the source line control signal SL_S, a page buffer control signal PB_S, and a column address CADD, in response to a command CMD and an address ADD.

The page buffer 160 may be connected to the memory cell array 110 through the bit lines BL. The page buffer 160 may temporarily store data DATA received through the plurality of bit lines BL in response to the page buffer control signal PB_S. The page buffer 160 may sense a voltage or a current of the plurality of bit lines BL during the read operation.

The column decoder 170 may transmit the data DATA input from the input-output circuit 180 to the page buffer 160 in response to the column address CADD, or transmit the data DATA stored in the page buffer 160 to the input-output circuit 180. The column decoder 170 may transmit and receive the data DATA to and from the input-output circuit 180 through column lines CLL, and may transmit and receive the data DATA to and from the page buffer 160 through data lines DTL.

The input-output circuit 180 may transmit the command CMD and the address ADD received from an external device (for example, a controller) connected to the memory device 100 to the control circuit 150, and output the data received from the column decoder 170 to the external device.

Figure 2:
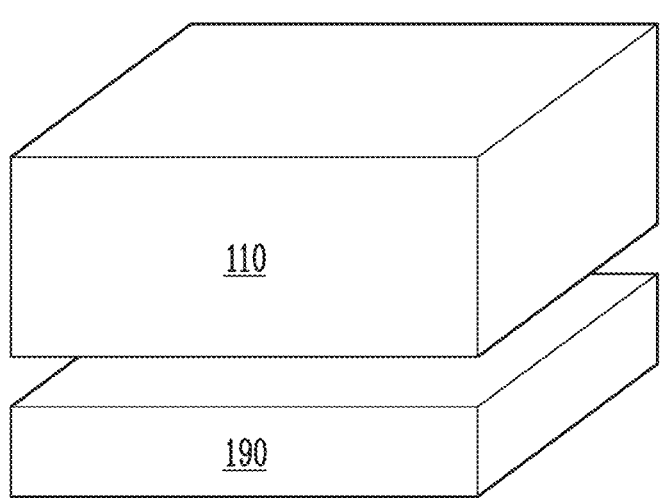
FIG. 2 is a diagram illustrating a disposition structure of a memory cell array and a peripheral circuit.
Figure 2:
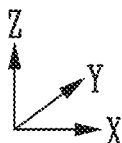

FIG. 2 is a diagram illustrating a disposition structure of the memory cell array 110 and the peripheral circuit 190.

Referring to FIG. 2, the memory cell array 110 may be stacked on the peripheral circuit 190. For example, when a substrate is formed along an X-Y plane, the peripheral circuit 190 may be stacked from the substrate in a Z direction, and the memory cell array 110 may be stacked on the peripheral circuit 190.

Figure 3:
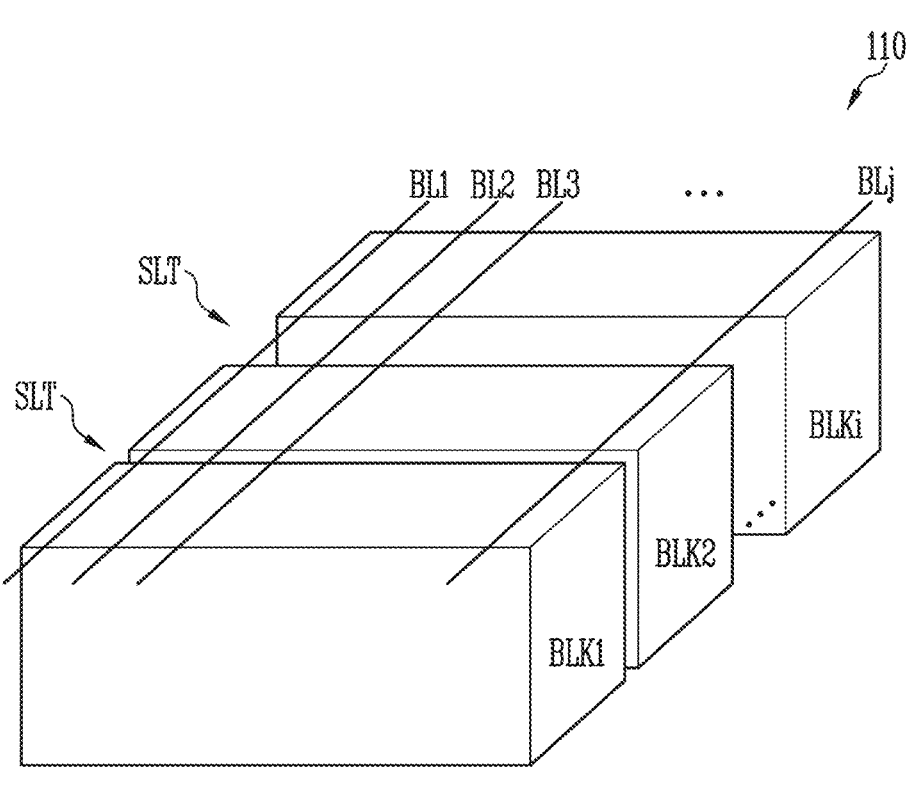
FIG. 3 is a diagram illustrating a structure of a memory cell array.
Figure 3:
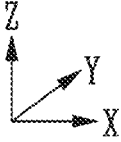

FIG. 3 is a diagram illustrating a structure of the memory cell array 110.

Referring to FIG. 3, the memory cell array 110 may include first to i-th memory blocks BLK1 to BLKi (i is a positive integer). The first to i-th memory blocks BLK1 to BLKi may be arranged to be spaced apart from each other in a Y direction, and may be commonly connected to first to j-th bit lines BL1 to BLj. For example, the first to j-th bit lines BL1 to BLj may extend along the Y direction and may be spaced apart from each other along an X direction. The first to i-th memory blocks BLK1 to BLKi may be separated from each other by slits SLT.

Figure 4:
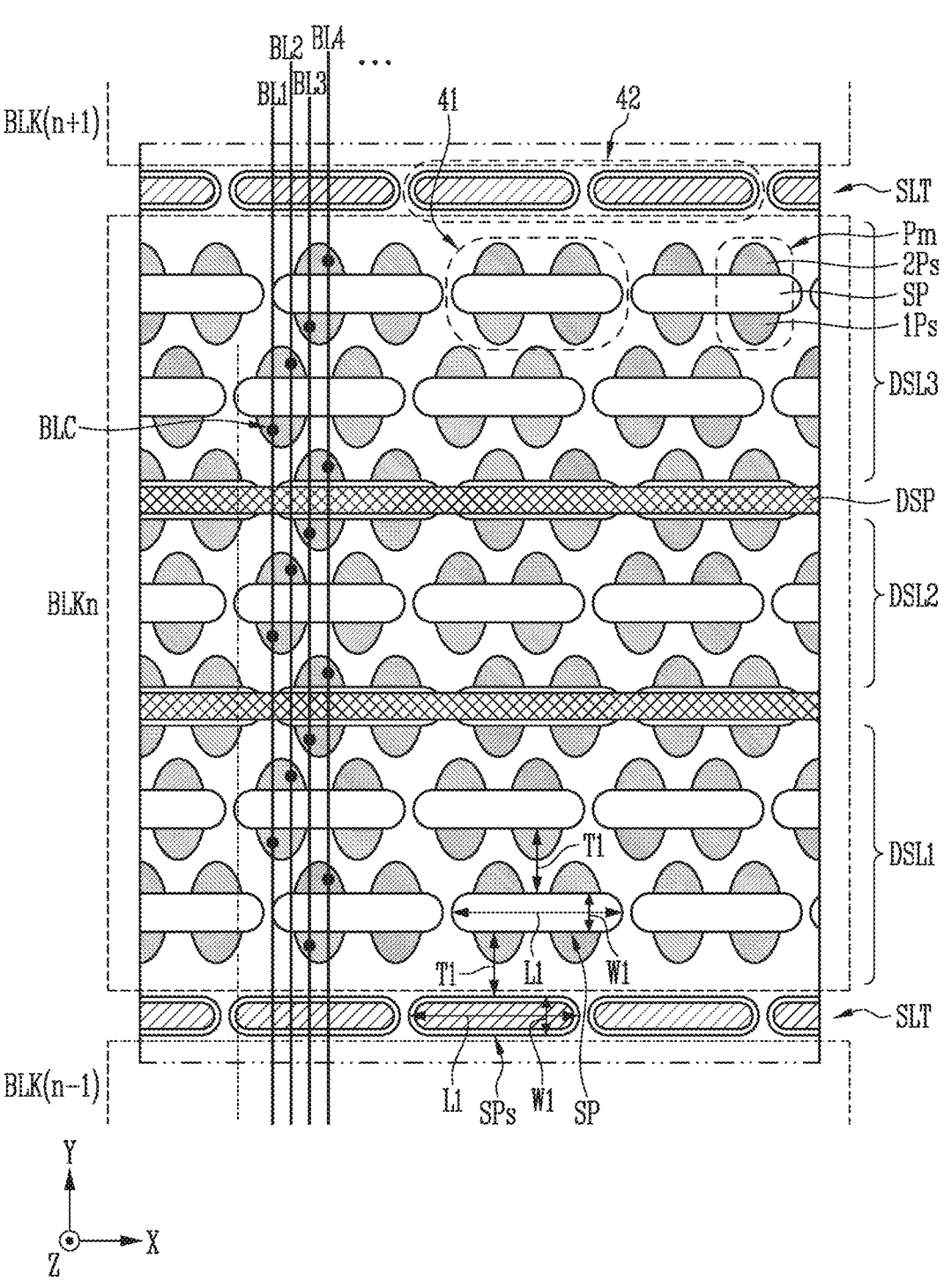
FIG. 4 is a diagram illustrating a layout of a memory device according to an embodiment of the present disclosure.

FIG. 4 is a diagram illustrating a layout of a memory device according to an embodiment of the present disclosure.

Referring to FIG. 4, an (n−1)-th memory block BLK(n−1), an n-th memory block BLKn, and an (n+1)-th memory block BLK(n+1) included in the memory device may be spaced apart from each other in the Y direction. The (n−1)-th memory block BLK(n−1), the n-th memory block BLKn, and the (n+1)-th memory block BLK(n+1) may be configured identically to each other, and may be separated from each other by the slits SLT.

Because the (n−1)-th memory block BLK(n−1), the n-th memory block BLKn, and the (n+1)-th memory block BLK(n+1) may be configured identically to each other, the n-th memory block BLKn among the (n−1)-th memory block BLK(n−1), the n-th memory block BLKn, and the (n+1)-th memory block BLK(n+1) is described as an example.

The n-th memory block BLKn may include a plurality of main plugs Pm including memory cells. The main plug Pm may include first and second sub-plugs 1Ps and 2Ps separated by a separation pattern SP. FIG. 4 shows a structure in which two main plugs Pm are separated into first and second sub-plugs 1Ps and 2Ps by one separation pattern SP, but the number of main plugs Pm separated by one separation pattern SP is not limited to the number shown in the drawing. For example, in different embodiments, one main plug Pm may be separated into the first and second sub-plugs 1Ps and 2Ps by one separation pattern SP, or each of three main plugs Pm may be separated into the first and second sub-plugs 1Ps and 2Ps by one separation pattern SP. The separation pattern SP may have an ellipse shape. A long axis of the separation pattern SP becomes the X direction, and a short axis becomes the Y direction. In an embodiment to be described below, a structure in which each of two main plugs Pm is separated into the first and second sub-plugs 1Ps and 2Ps by one separation pattern SP is described.

Because different bit lines are connected to the first and second sub-plugs 1Ps and 2Ps, memory cells included in the first and second sub-plugs 1Ps and 2Ps may configure different strings. For example, the first sub-plug 1Ps may be connected to the first bit line BL1 through a bit line contact BLC, and the second sub-plug 2Ps may be connected to the second bit line BL2 through a bit line contact BLC.

At least one drain separation pattern DSP may be formed in each of the (n−1)-th to (n+1)-th memory blocks BLK(n−1) to BLK(n+1). The drain separation pattern DSP may be a pattern separating drain selection lines included in the memory block. For example, the n-th memory block BLKn may include first to third drain selection lines DSL1 to DSL3 separated from each other by the drain separation patterns DSP. Because the first to third drain selection lines DSL1 to DSL3 are separated from each other by the drain separation patterns DSP, different voltages may be applied to the first to third drain selection lines DSL1 to DSL3.

In the layout shown in FIG. 4, the drain separation patterns DSP are formed in an area overlapping the separation patterns SP in the X direction, but in other embodiments, the drain separation patterns DSP may be formed in an area not overlapping the separation patterns SP.

Because the (n−1)-th to (n+1)-th memory blocks BLK(n−1) to BLK(n+1) are divided from each other by the slits SLT, gate lines included in different memory blocks may be separated from each other by the slits SLT. For example, gate lines included in the (n−1)-th memory block BLK(n−1) and gate lines included in the n-th memory block BLKn may be separated from each other through the slit SLT.

The slit SLT according to the present embodiment may include a plurality of slit patterns SPs. A layout of the slit patterns SPs may be the same as a layout of the separation patterns SP separating the main plugs Pm. Therefore, each of the slit patterns SPs may have an ellipse shape. A long axis of each of the slit patterns SPs becomes the X direction, and a short axis becomes the Y direction. For example, when a length of the X-direction of the separation pattern SP is a first length L1, the slit pattern SPs may also have the first length L1. When a width of the Y direction of the separation pattern SP is a first width W1, the slit pattern SPs may also have the first width W1. When a distance between the separation patterns SP adjacent in the Y direction is a first distance T1, a distance between the slit pattern SPs and the separation pattern SP may also be the first distance T1.

Referring to the layout of the slit patterns SPs, the slit patterns SPs to be disposed in the X direction are spaced apart from each other, but the slit patterns SPs contact each other in a lower portion of the slit patterns SPs. Here, a lower portion of the slit patterns SPs means a lower portion in the Z direction. Structures through which the slit patterns SPs contact each other are not shown in the layout of FIG. 4. The structures (CNS) through which the slit patterns SPs contact each other are described later with reference to FIGS. 8B and 9, for example.

A plug area 41 including the memory cells and a slit area 42 separating the memory blocks are described in detail as follows.

Figure 5:
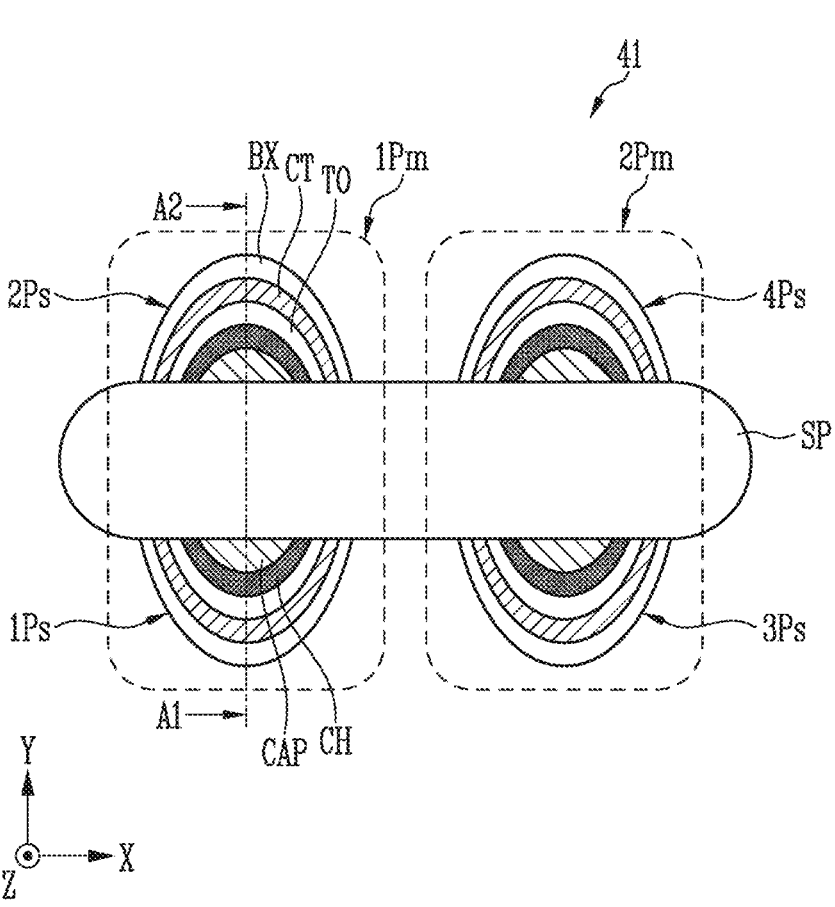
FIG. 5 is a layout illustrating a structure of a plug area according to an embodiment of the present disclosure.

FIG. 5 is a layout illustrating a structure of a plug area 41 according to an embodiment of the present disclosure.

Referring to FIG. 5, first and second main plugs 1Pm and 2Pm and a separation pattern SP may be formed in the plug area 41. The first and second main plugs 1Pm and 2Pm may be arranged to be spaced apart from each other in the X direction and each of the first and second main plugs 1Pm and 2Pm may be configured to extend along the Y direction. The separation pattern SP may extend along the X direction to separate each of the first and second main plugs 1Pm and 2Pm.

The first main plug 1Pm may include first and second sub-plugs 1Ps and 2Ps separated by the separation pattern SP, and the second main plug 2Pm may include third and fourth sub-plugs 3Ps and 4Ps separated by the separation pattern SP. The third sub-plug 3Ps may be formed in the same structure as the first sub-plug 1Ps, and the fourth sub-plug 4Ps may be formed in the same structure as the second sub-plug 2Ps. The structure of the first sub-plug 1Ps may be symmetrical with that of the second sub-plug 2Ps with respect to the separation pattern SP, and the structure of the third sub-plug 3Ps may be symmetrical with that of the fourth sub-plug 4Ps with respect to the separation pattern SP.

Because the first to fourth sub-plugs 1Ps to 4Ps are configured similarly to each other, the structure of the first sub-plug 1Ps among the first to fourth sub-plugs 1Ps to 4Ps is described as an example as follows.

The first sub-plug 1Ps may include a capping layer CAP, a channel layer CH, a tunnel insulating layer TO, a charge trap layer CT, and a blocking layer BX. The capping layer CAP may be formed on an upper end of the first sub-plug 1Ps formed in a vertical direction from the substrate, and may be used to improve an electrical characteristic of the drain selection transistors. For example, the capping layer CAP may be formed of a conductive material. For example, the capping layer CAP may be formed of a doped poly-silicon layer. Although not shown in FIG. 5, a core pillar may be formed under the capping layer CAP. For example, the core pillar may be formed of an insulating material or a conductive material. The channel layer CH may be formed to surround the capping layer CAP and the core pillar, and may be formed of a conductive material. For example, the channel layer CH may be formed of a polysilicon layer. The tunnel insulating layer TO may be formed to surround the channel layer CH, and may be formed of an insulating material. For example, the tunnel insulating layer TO may be formed of an oxide layer or a silicon oxide layer. The charge trap layer CT may be formed to surround the tunnel insulating layer TO, and may be formed of a material capable of trapping an electron. For example, the charge trap layer CT may be formed of a nitride layer. The blocking layer BX may be formed to surround the charge trap layer CT, and may be formed of an insulating material. For example, the blocking layer BX may be formed of an oxide layer or a silicon oxide layer.

Although not shown in the drawing, the first to fourth sub-plugs 1Ps to 4Ps may be electrically connected to different bit lines through different bit line contacts BLC. For example, a channel layer CH of the first sub-plug 1Ps may be connected to a first bit line through a bit line contact, a channel layer CH of the second sub-plug 2Ps may be connect to a second bit line through a bit line contact, a channel layer CH of the third sub-plug 3Ps may be connected to a third bit line through a bit line contact, and a channel layer CH of the fourth sub-plug 4Ps may be connected to a fourth bit line through a bit line contact.

A structure of the first and second sub-plugs 1Ps and 2Ps is described in detail with reference to FIG. 6.

Figure 6:
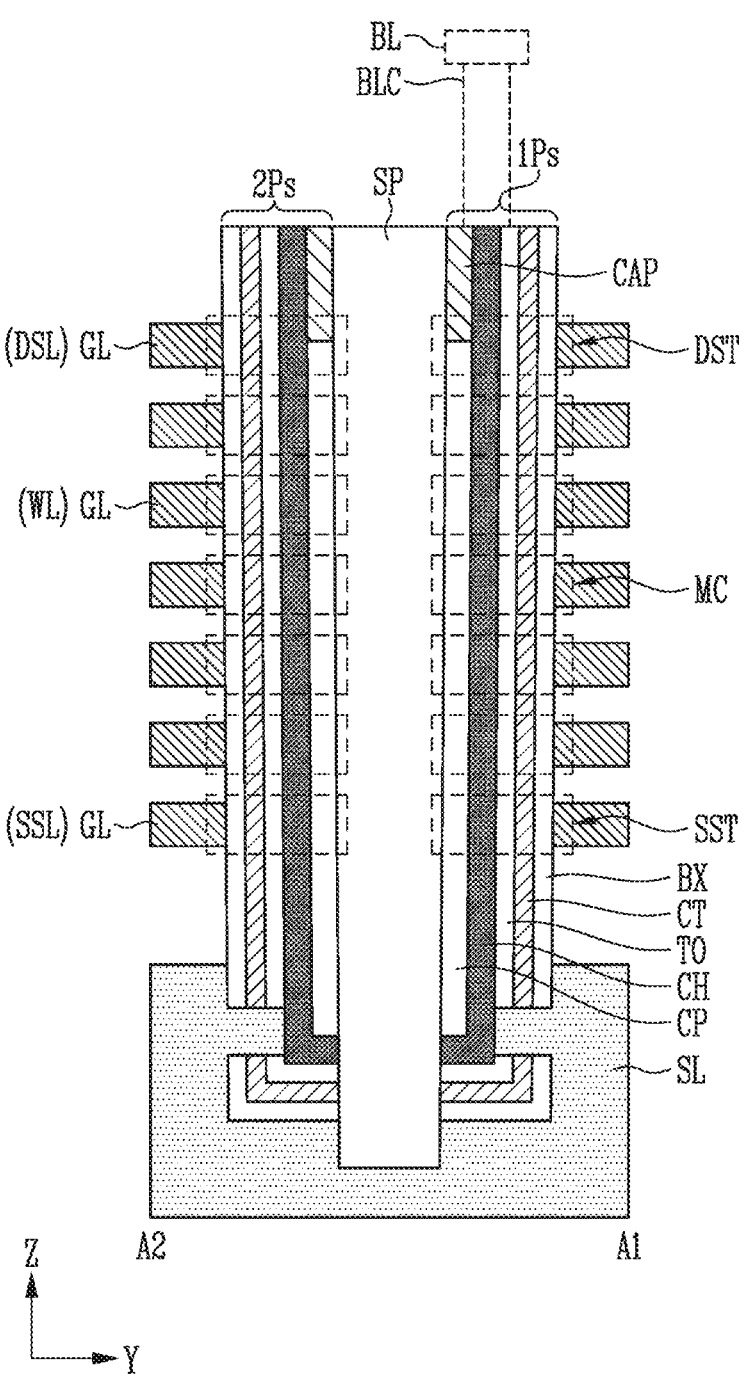
FIG. 6 is a cross-sectional view illustrating a structure of a plug area according to an embodiment of the present disclosure.

FIG. 6 is a cross-sectional view illustrating a structure of a plug area 41 according to an embodiment of the present disclosure.

Referring to FIGS. 5 and 6, a cross-section of the first and second sub-plugs 1Ps and 2Ps taken along an A1-A2 direction is shown.

The first and second sub-plugs 1Ps and 2Ps and the separation pattern SP may be formed on a source line SL in a vertical direction. The separation pattern SP may be formed between the first and second sub-plugs 1Ps and 2Ps, and the capping layer CAP, the core pillar CP, the channel layer CH, the tunnel insulating layer TO, the charge trap layer CT, and the blocking layer BX included in the first and second sub-plugs 1Ps and 2Ps are separated by the separation pattern SP. Gate lines GL may surround the first and second sub-plugs 1Ps and 2Ps and the separation pattern SP, and may be spaced apart from each other in the Z direction. A lower portion of the channel layer CH may contact the source line SL, and an upper portion of the channel layer CH may contact the bit line contact BLC.

Among the gate lines GL, lines formed in a lower portion may be used as a source selection line SSL, and lines formed in an upper portion may be used as a drain selection line DSL. The source selection line SSL may be connected to a gate of a source selection transistor SST, and the drain selection line DSL may be connected to a gate of a drain selection transistor DST. The source selection transistor SST may be configured to electrically connect or disconnect between the source line SL and the channel layer CH in a string, and the drain selection transistor DST may be configured to electrically connect or disconnect the bit line and the channel layer CH in the string. Among the gate lines GL, lines formed between the source selection line SSL and the drain selection line DSL may be used as a word line WL. The word line WL may be connected to a gate of the memory cell MC.

The bit line contact BLC may be formed on the channel layer CH of the first sub-plug 1Ps, and a bit line BL may be formed on the bit line contact BLC.

Figure 7:
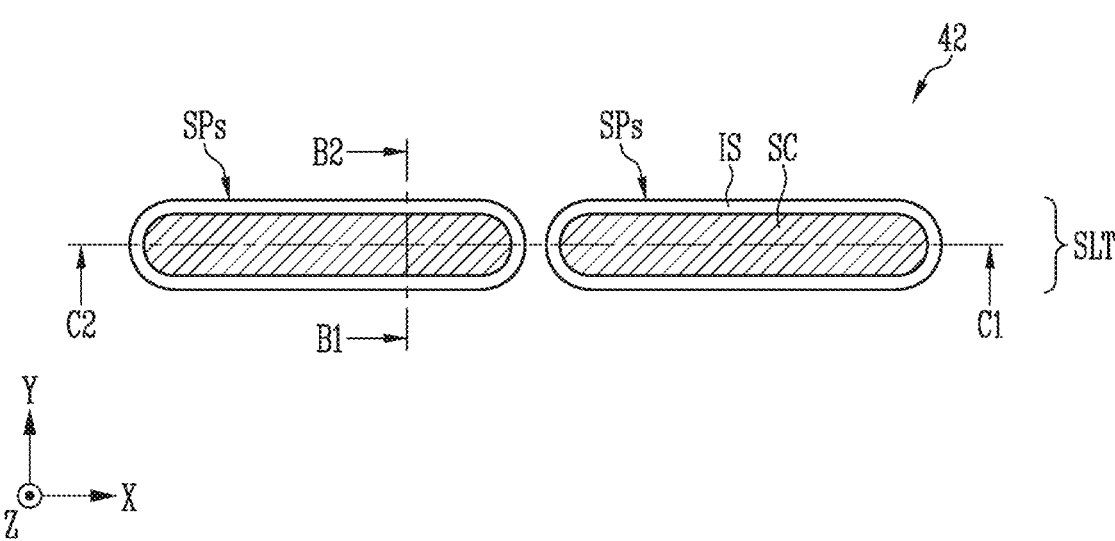
FIG. 7 is a layout illustrating a structure of a slit area according to an embodiment of the present disclosure.

FIG. 7 is a layout illustrating a structure of a slit area 42 according to an embodiment of the present disclosure.

Referring to FIG. 7, the slit SLT formed in the slit area 42 may include a plurality of slit patterns SPs. Each of the plurality of slit patterns SPs may include an insulating layer IS and a source contact SC. The source contact SC may be in contact with the source line formed under the memory blocks, and the insulating layer IS may be formed to electrically disconnect the source contact SC and the gate lines. For example, the insulating layer IS may be formed to surround a periphery of the source contact SC. The insulating layer IS may be formed of an oxide layer or a silicon oxide layer. The source contact SC may be formed of a conductive material. For example, the source contact SC may be formed of doped poly-silicon or tungsten.

Uppermost ends of the plurality of slit patterns SPs may be spaced apart from each other, but the plurality of slit patterns SPs may be connected to each other lower down in the Z direction. The structure of the slit pattern SPs is more specifically described with reference to a cross-section taken along a B1-B2 direction and a cross-section taken along a C1-C2 direction.

Figure 8A:
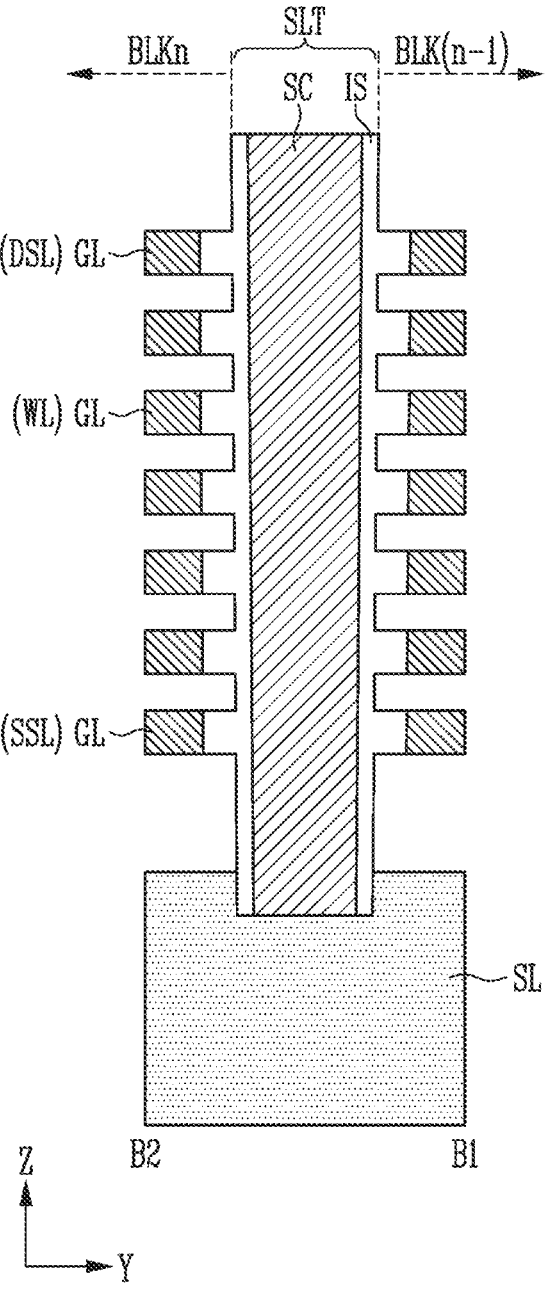
FIGS. 8A and 8B are cross-sectional views illustrating a structure of a slit area according to an embodiment of the present disclosure.
Figure 8B:
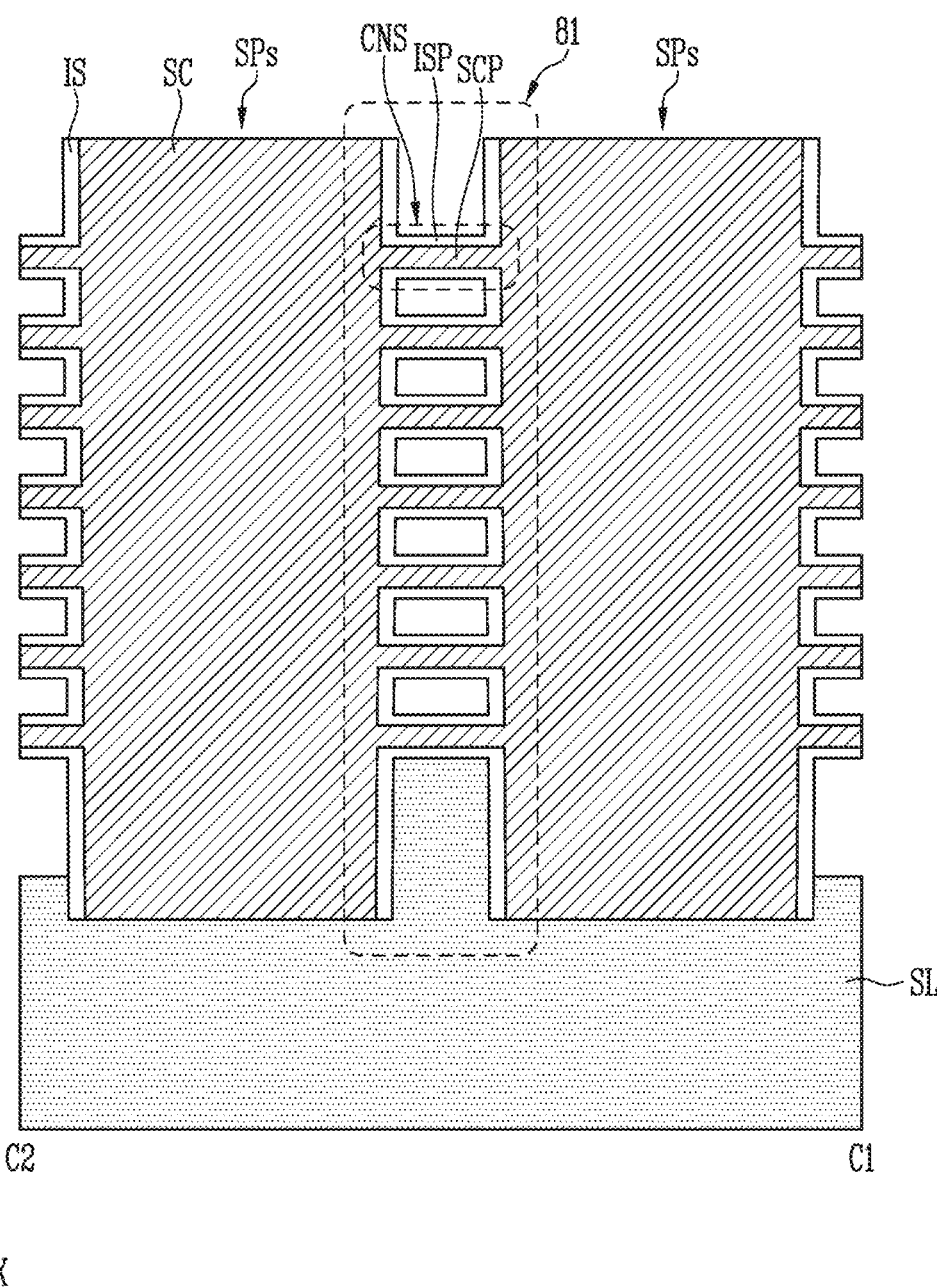

FIGS. 8A and 8B are cross-sectional views illustrating a structure of a slit area according to an embodiment of the present disclosure.

FIG. 8A shows a B1-B2 cross-section of FIG. 7.

Referring to FIGS. 7 and 8A, the slit SLT may include the source contact SC and the insulating layer IS. The source contact SC may be formed in a vertical direction on the source line SL, and the insulating layer IS may be formed to surround a periphery of the source contact SC. Gate lines GL included in the (n−1)-th memory block BLK(n−1) and the n-th memory block BLKn may be separated from each other by the slit SLT. For example, the gate lines GL may include the source selection line SSL, the word lines WL, and the drain selection line DSL; and the source selection line SSL, the word lines WL, and the drain selection line DSL may be included in each of the (n−1)-th memory block BLK(n−1)

and the n-th memory block BLKn. The insulating layer IS may be formed around the source contact SC so that the source contact SC and the gate lines GL are blocked from each other. The insulating layer IS formed between the gate line GL and the source contact SC may be formed to be thicker than the insulating layer IS formed between the gate lines GL.

FIG. 8B shows a cross section C1-C2 of FIG. 7.

Referring to FIGS. 7 and 8B, the slit patterns SPs may be formed in a vertical direction from the source line SL, and the slit patterns SPs adjacent to each other may be connected to each other through connection structures CNS. For example, the connection structures CNS may be formed in a ladder shape 81 between the slit patterns SPs adjacent to each other. As pictured in FIG. 8B, each connection structure CNS represents the rung of a ladder. For example, the connection structures CNS may be formed for each layer in which the gate lines GL are formed. The connection structures CNS may include a conductive pattern SCP formed of the same material as the source contact SC of the slit patterns SPs adjacent to each other and also include an insulating pattern ISP surrounding the conductive pattern SCP. The insulating pattern ISP may be formed of the same material as the insulating layer IS. An interlayer insulating layer may be formed between the connection structures CNS.

Figure 9:
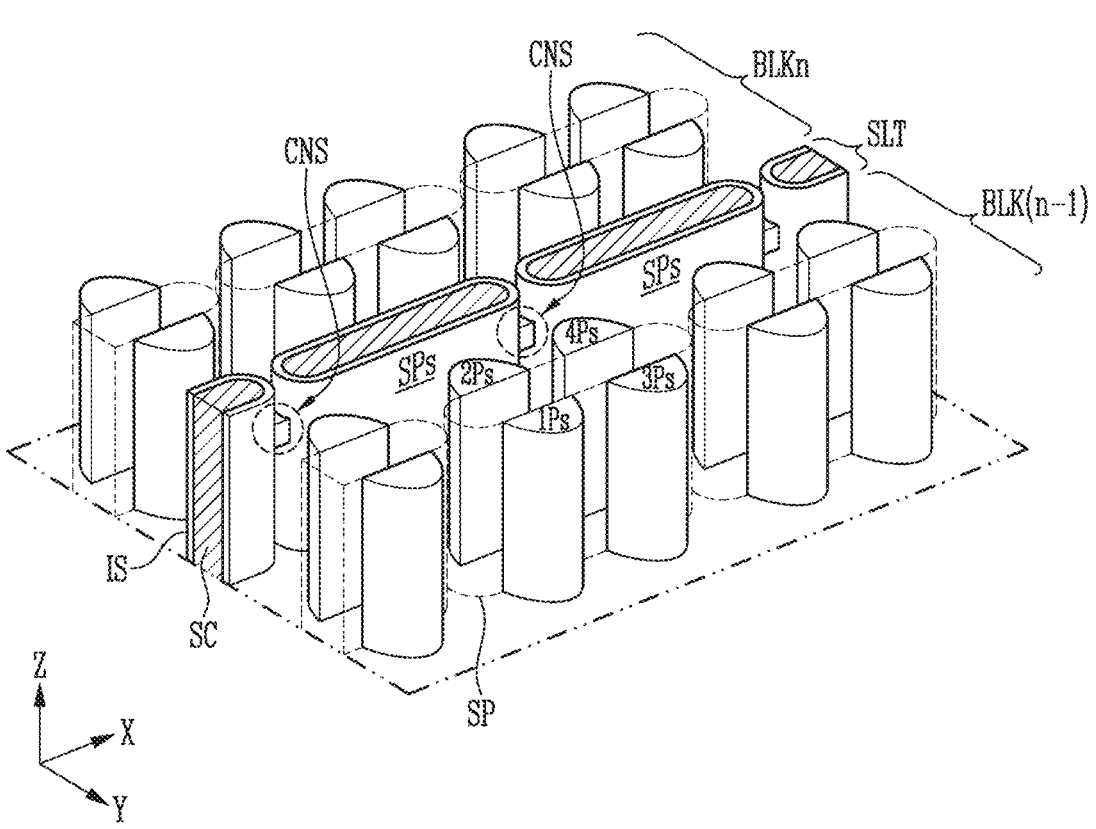
FIG. 9 is a perspective view illustrating a structure of a slit and memory blocks according to an embodiment of the present disclosure.

FIG. 9 is a perspective view illustrating a structure of a slit and memory blocks according to an embodiment of the present disclosure.

Referring to FIG. 9, the (n−1)-th and n-th memory blocks BLK(n−1) and BLKn formed in a three-dimensional structure may include a plurality of sub-plugs 1Ps to 4Ps formed in a vertical direction from a substrate (not shown). For example, the first and second sub-plugs 1Ps and 2Ps may be separated from each other by the separation pattern SP, and the third and fourth sub-plugs 3Ps and 4Ps may also be separated from each other by the separation pattern SP.

The slit SLT formed between the (n−1) and n-th memory blocks BLK(n−1) and BLKn may be formed in a vertical direction from the substrate (not shown) and may extend along the X direction. The slit SLT may include the slit patterns SPs spaced apart from each other in the X direction, and the connection structures CNS connecting the slit patterns SPs to each other. The slit patterns SPs and the connection structures CNS may include the source contact SC and the insulating layer IS surrounding the source contact SC.

Figure 10A:
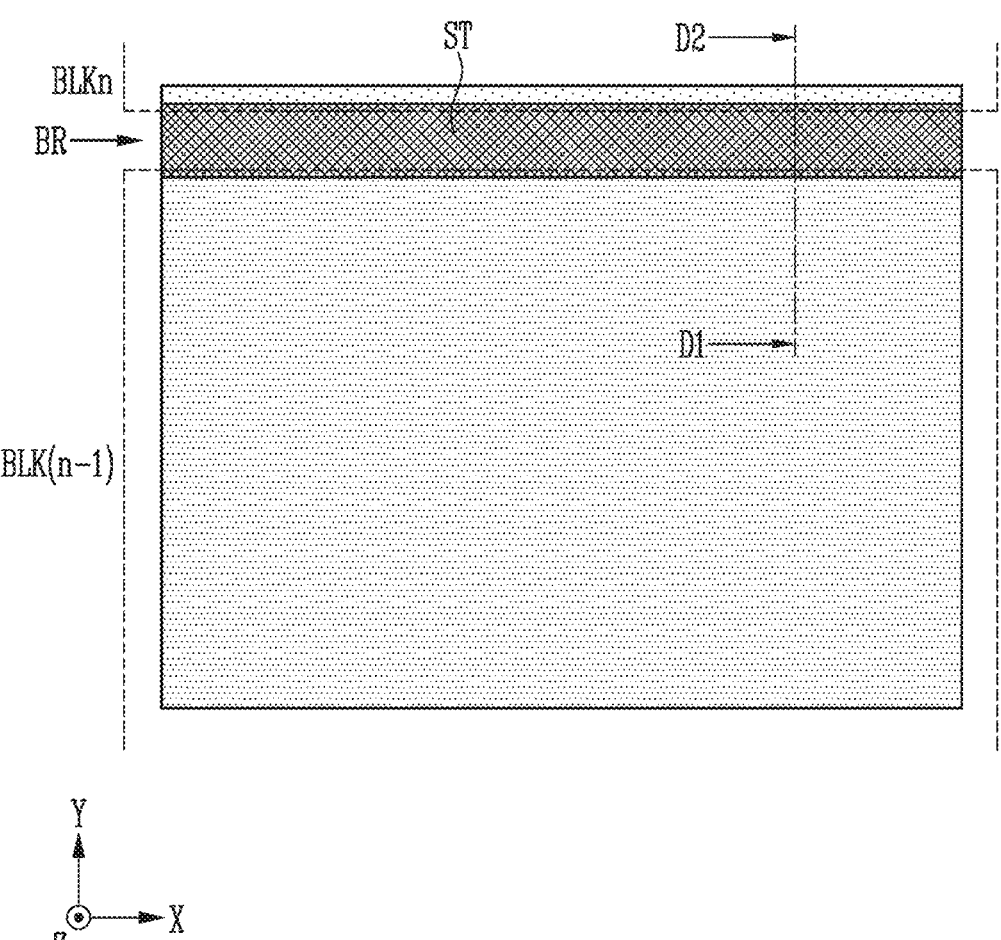
FIGS. 10A to 10N are layouts illustrating a method of manufacturing a memory device according to an embodiment of the present disclosure.
Figure 10B:
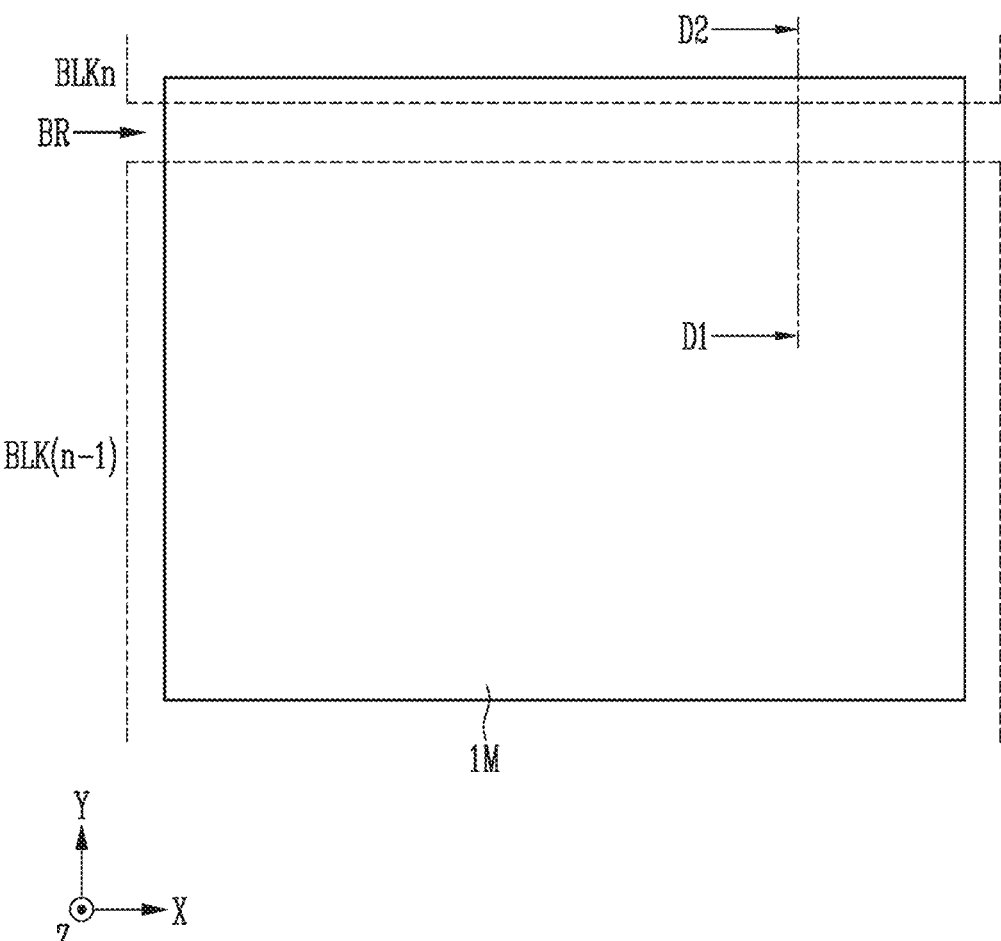
Figure 10C:
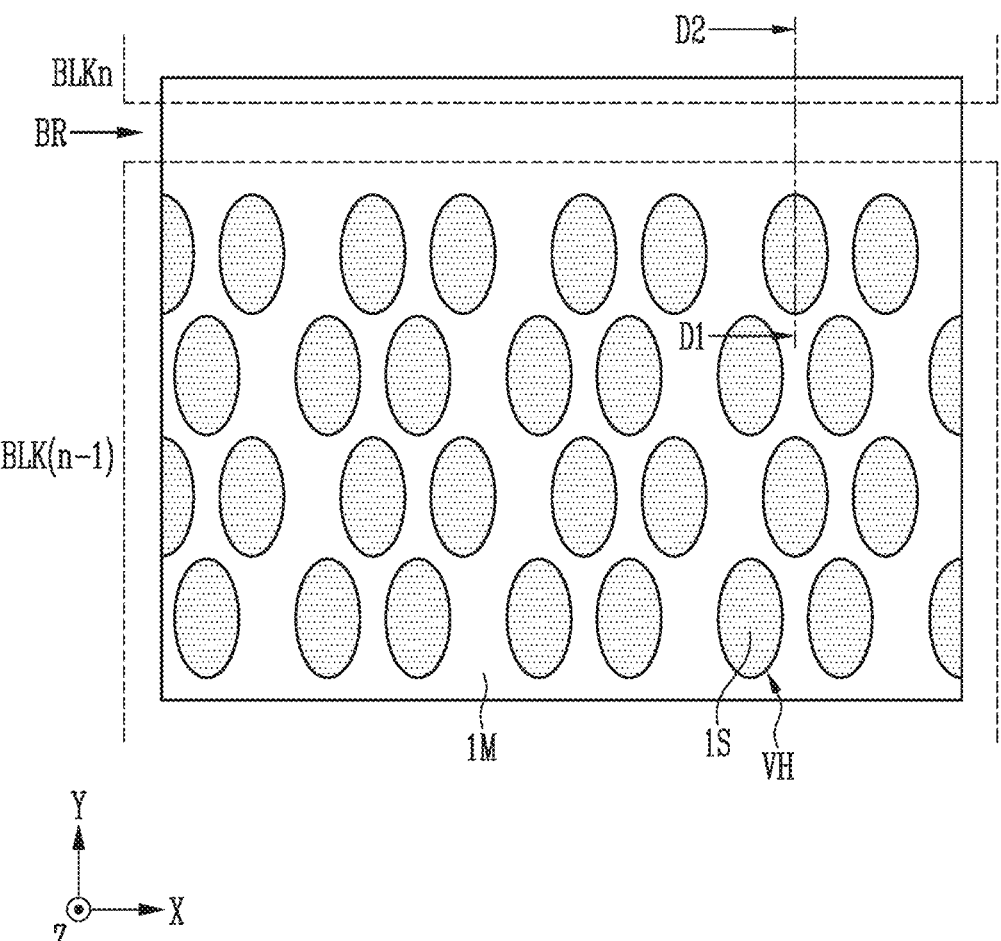
Figure 10D:
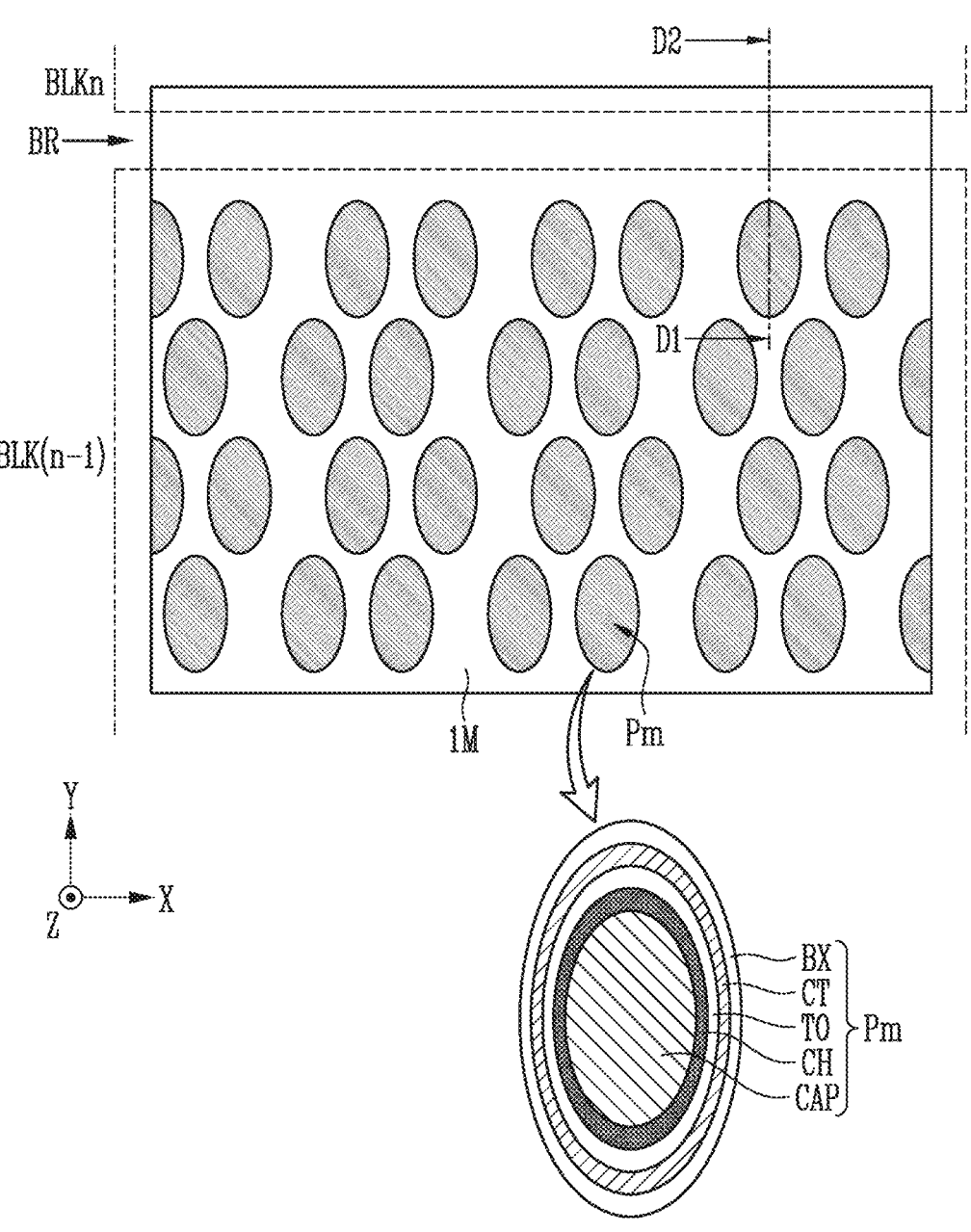
Figure 10E:
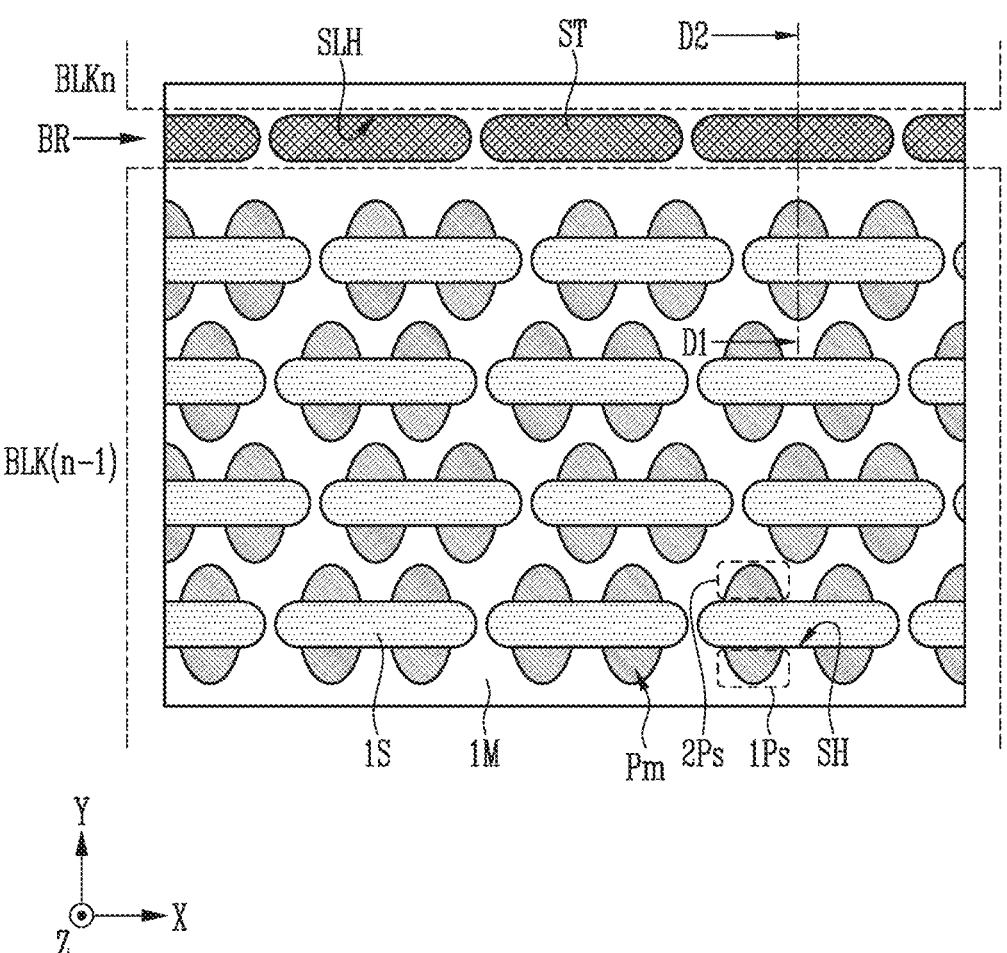
Figure 10F:
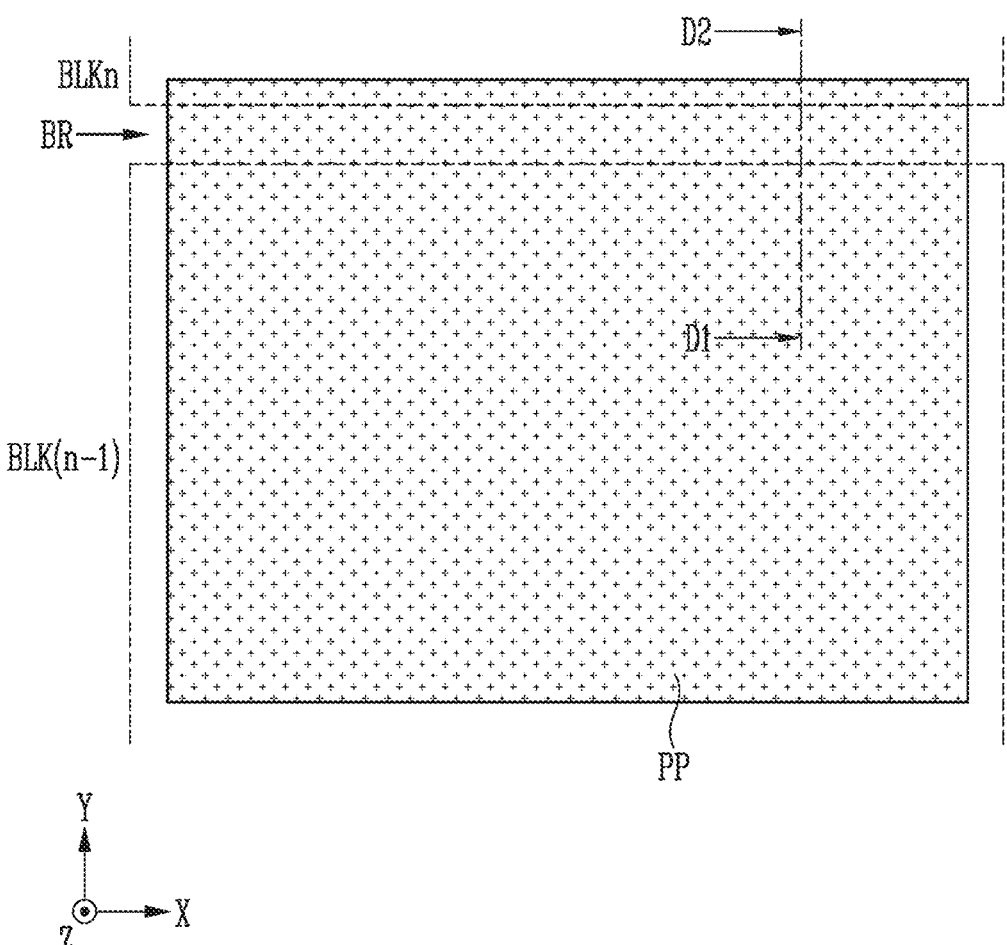
Figure 10G:
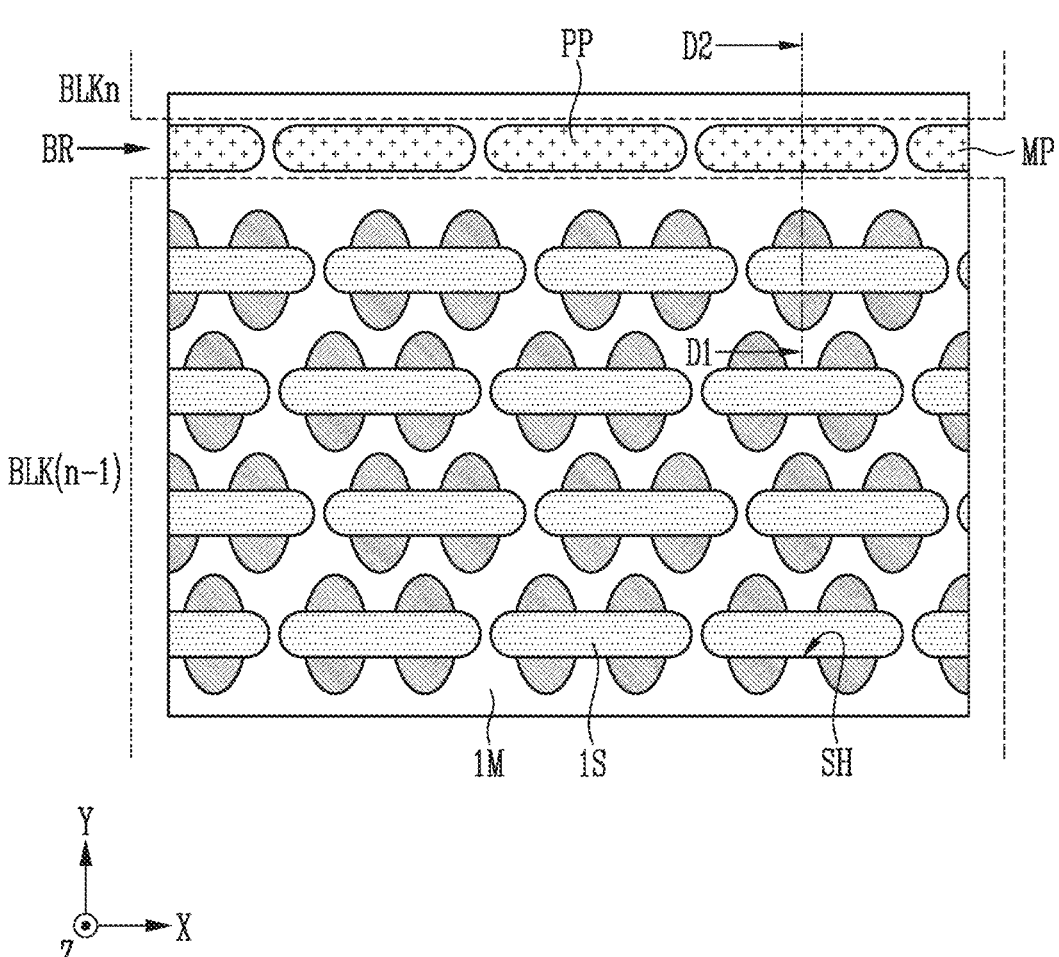
Figure 10H:
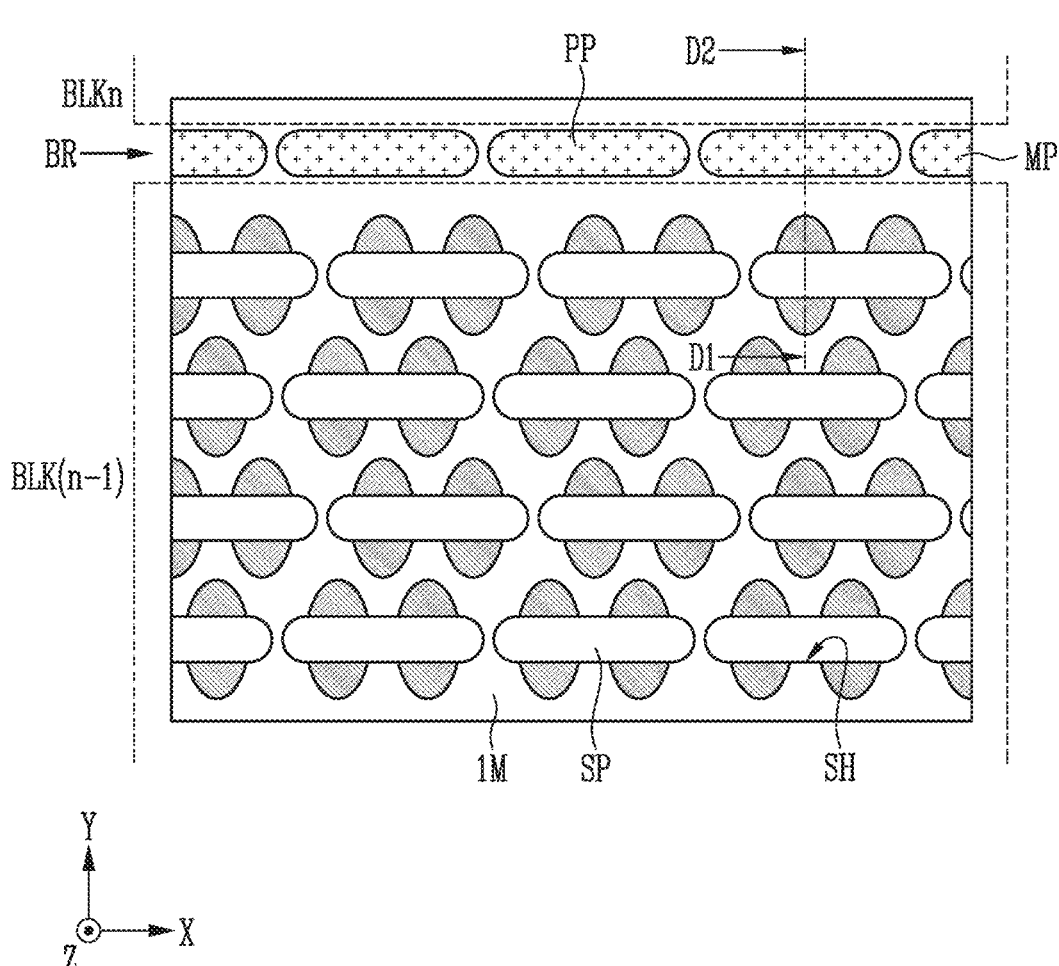
Figure 10I:
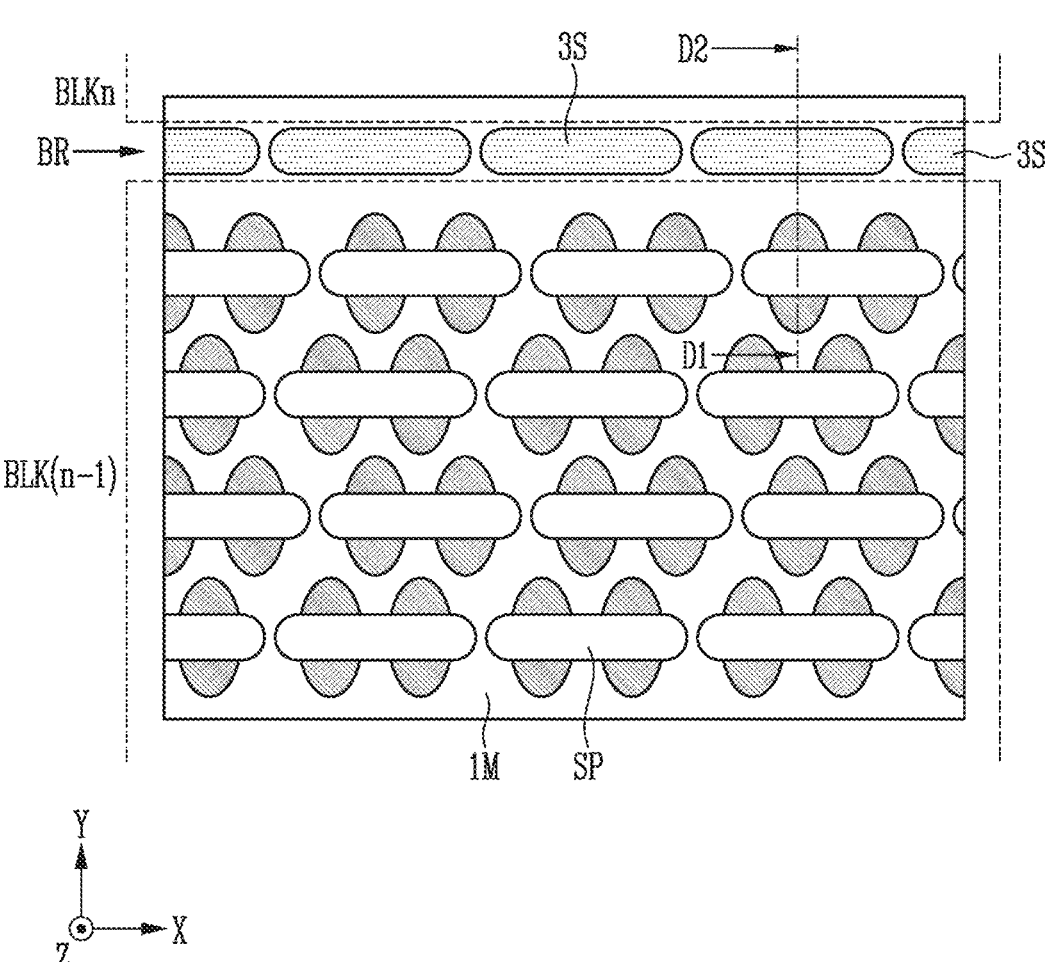
Figure 10J:
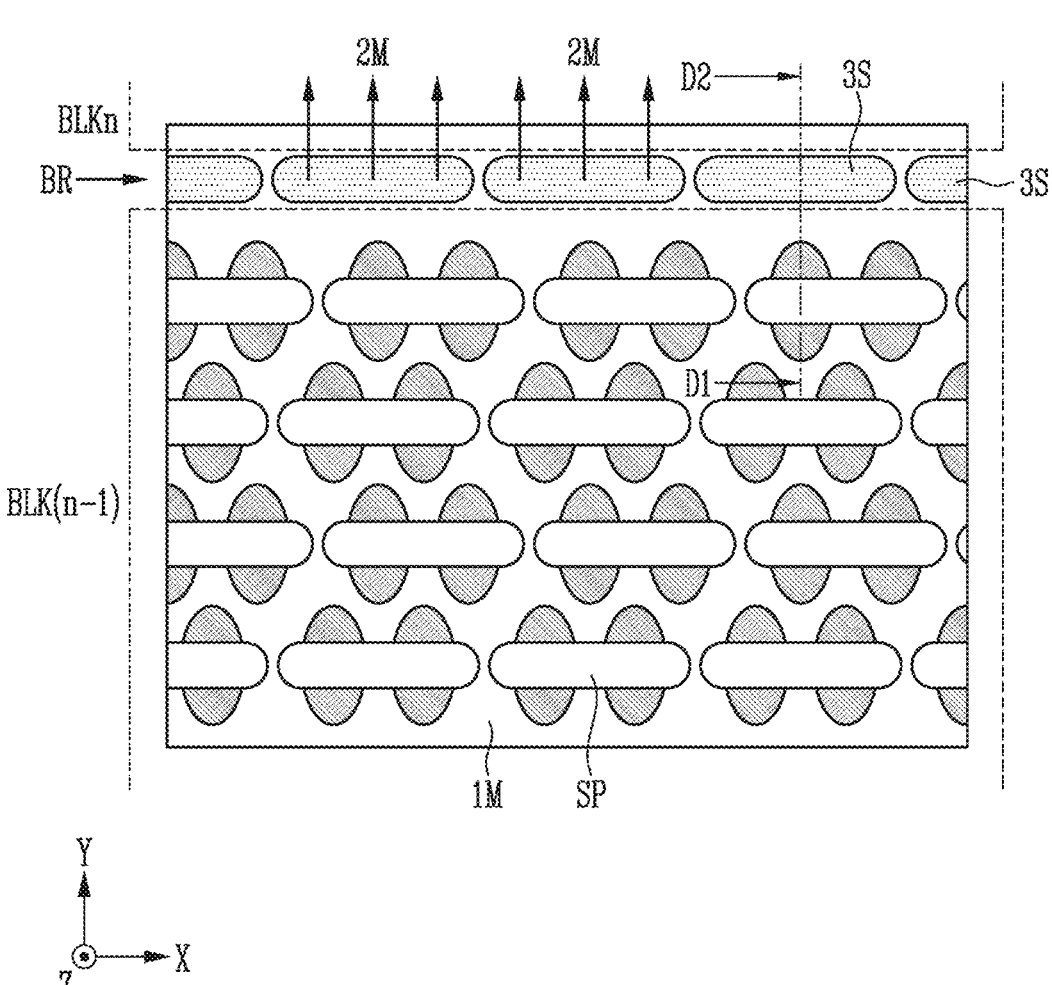
Figure 10K:
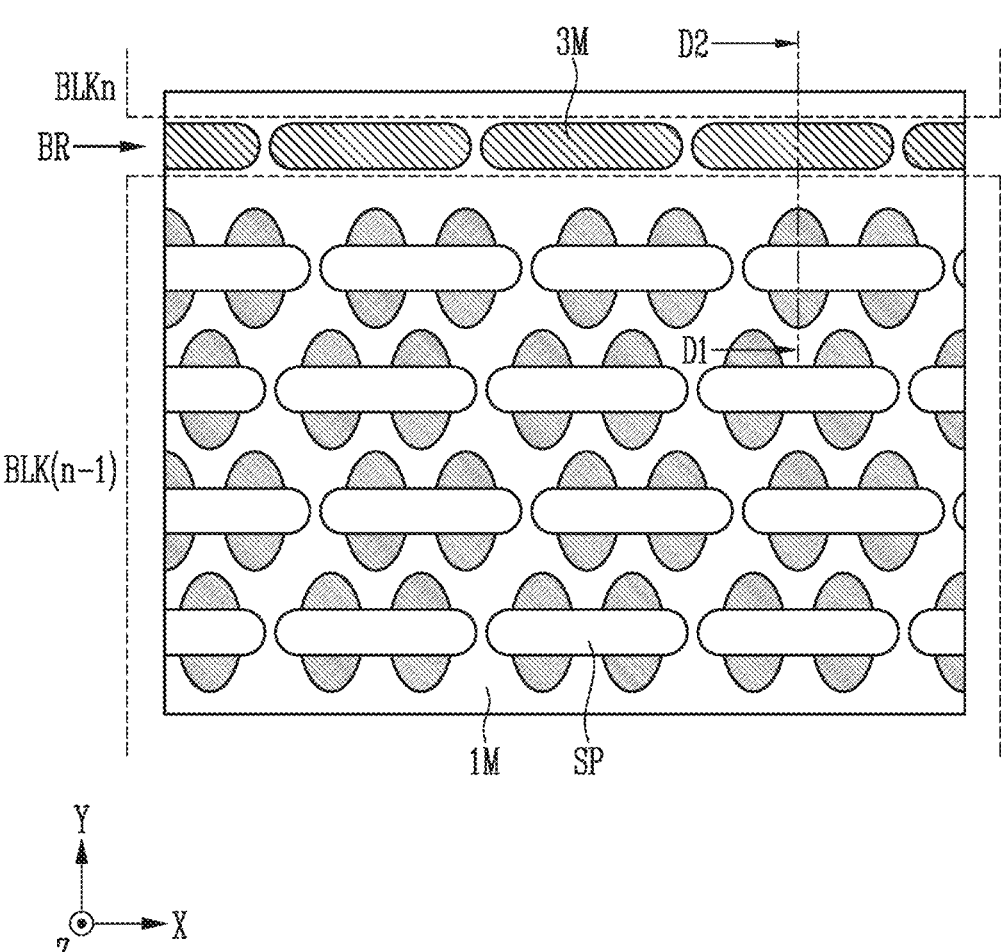
Figure 10L:
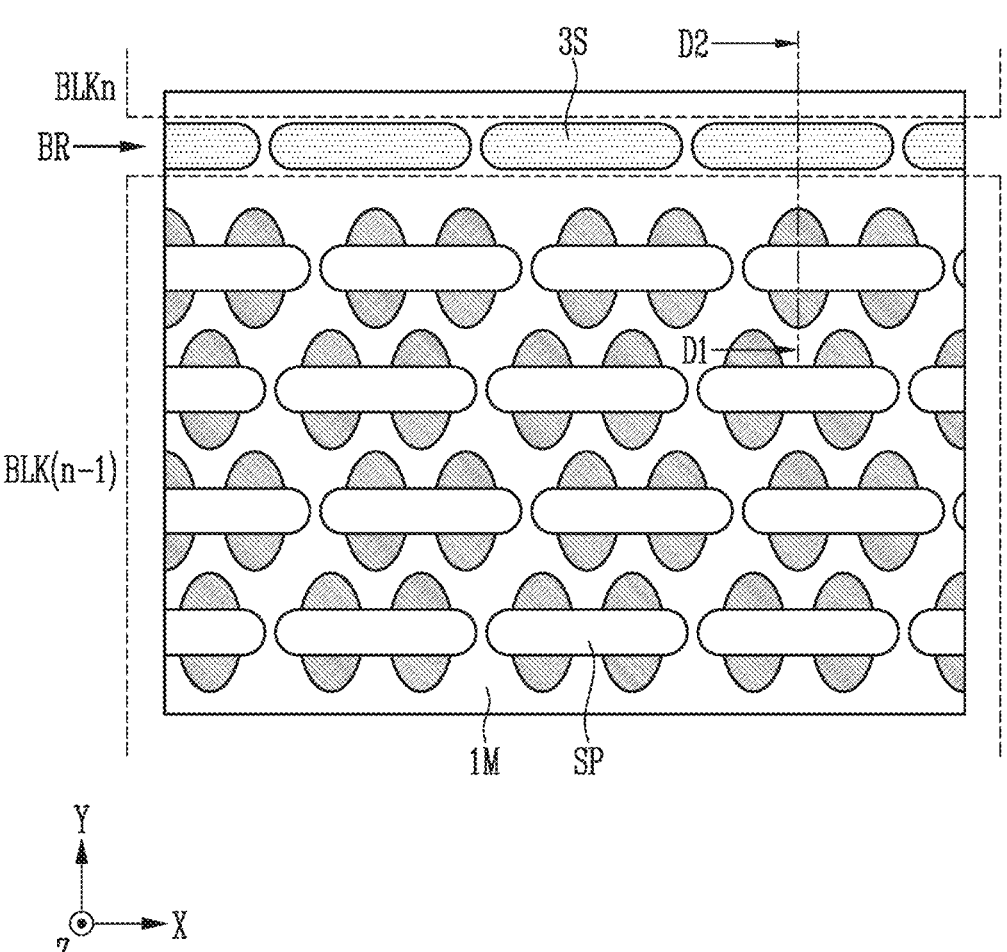
Figure 10M:
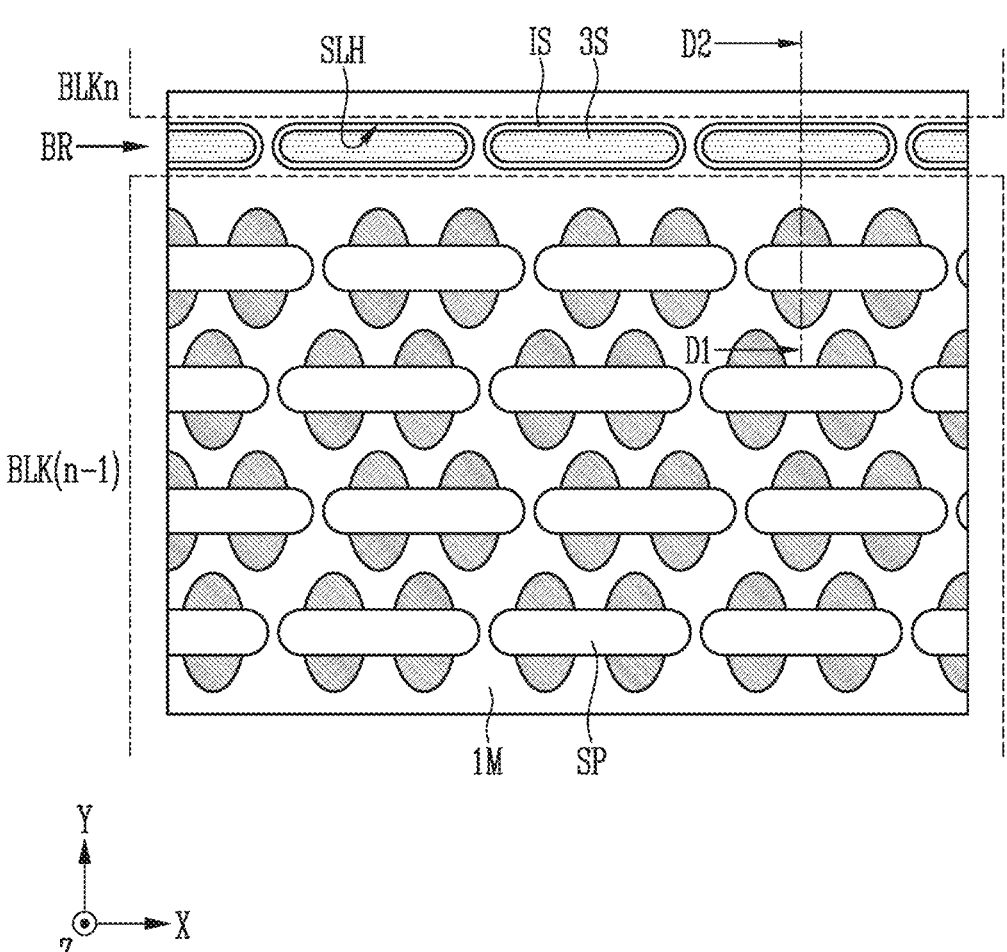
Figure 10N:
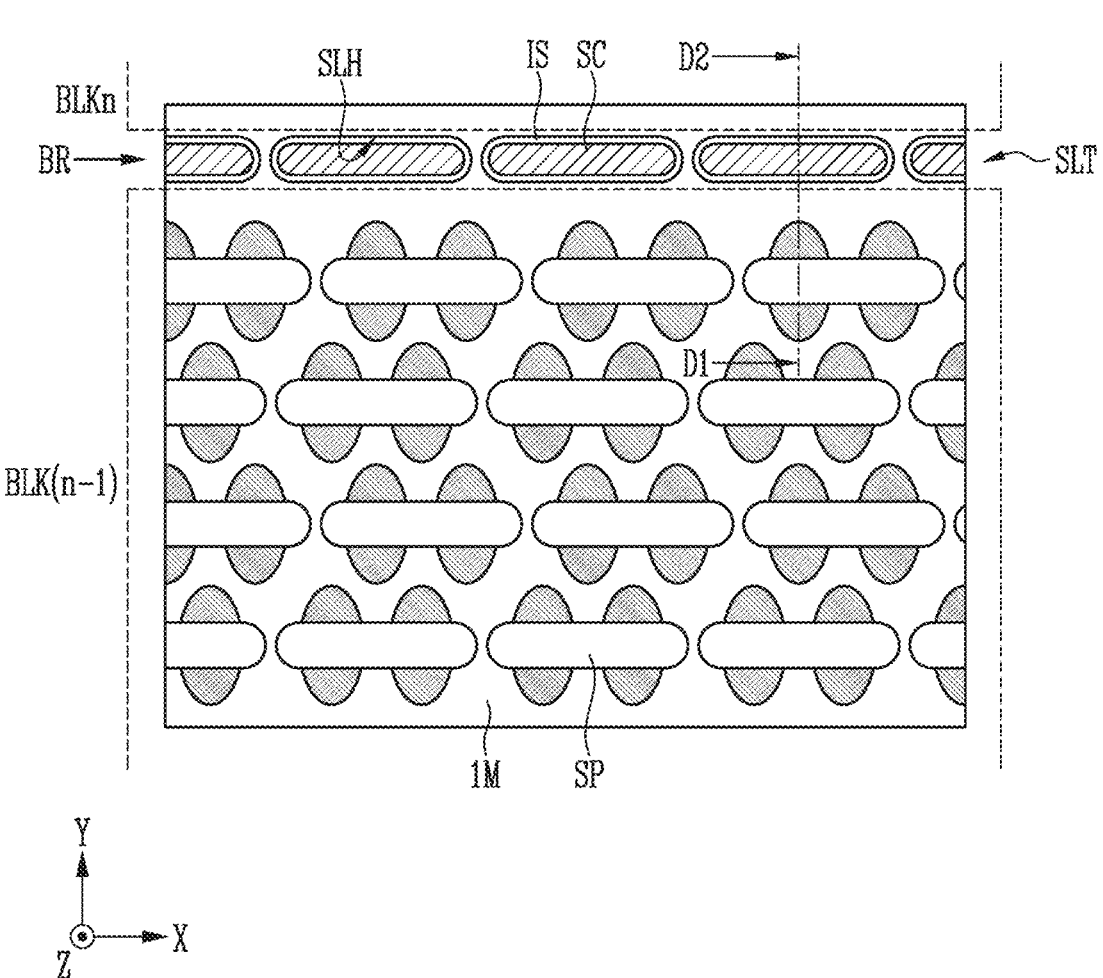
Figure 11A:
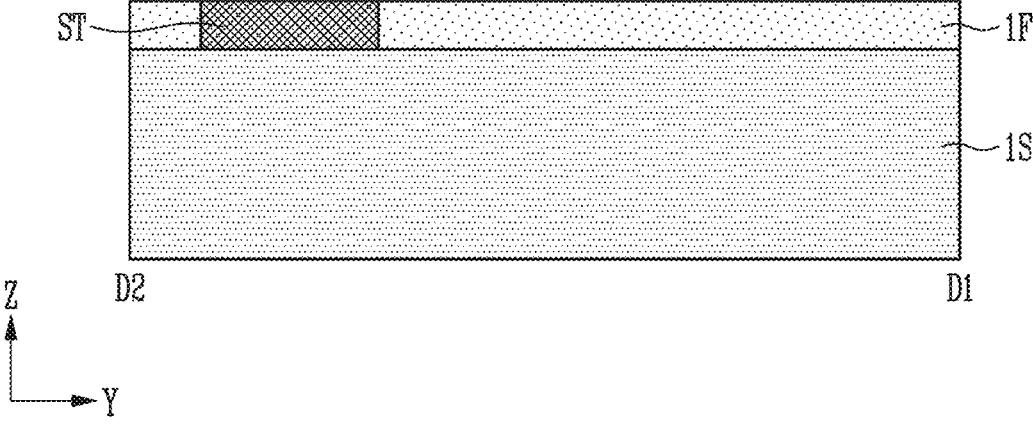
FIGS. 11A to 11N are cross-sectional views illustrating a method of manufacturing a memory device according to an embodiment of the present disclosure.
Figure 11B:
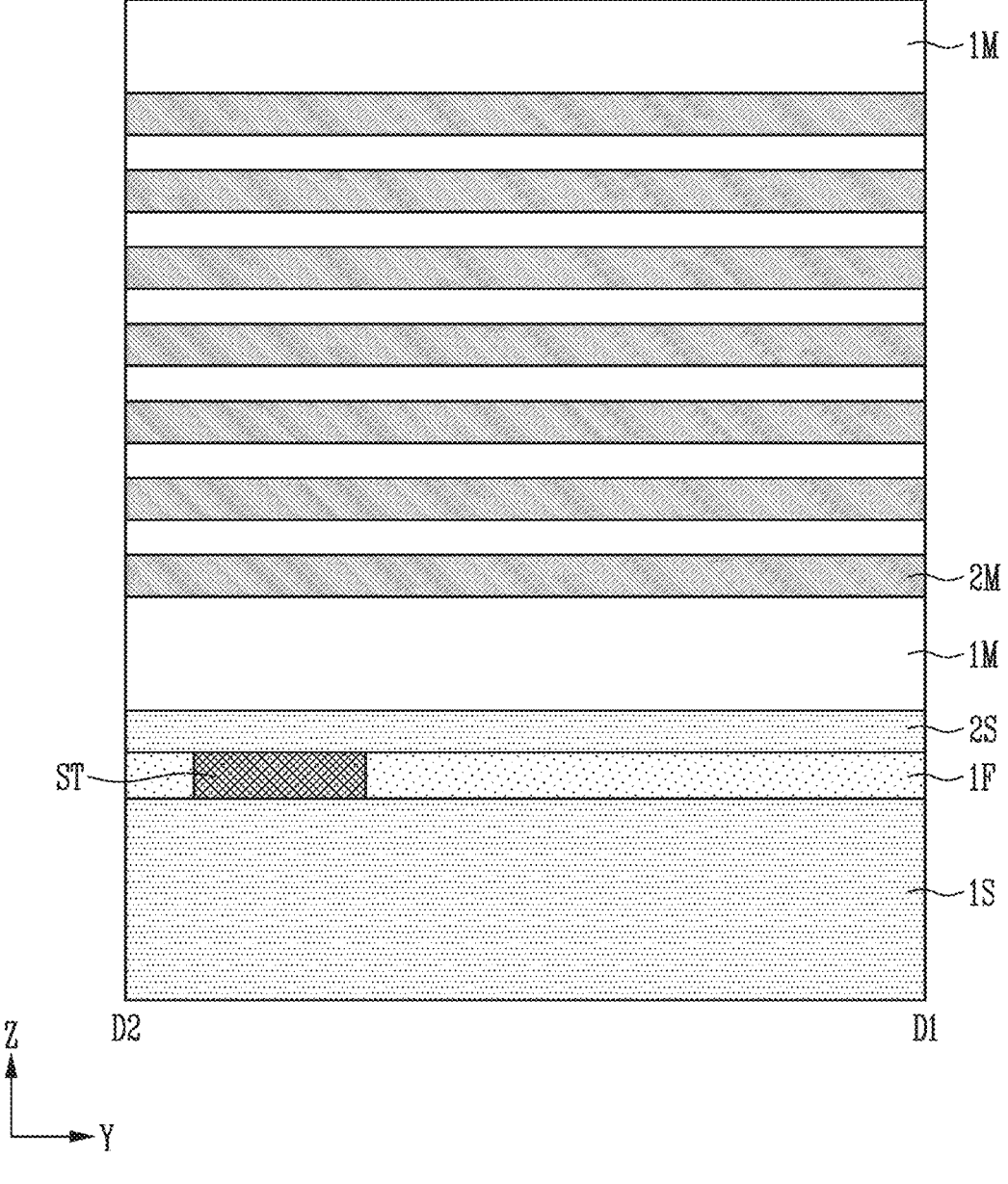
Figure 11C:
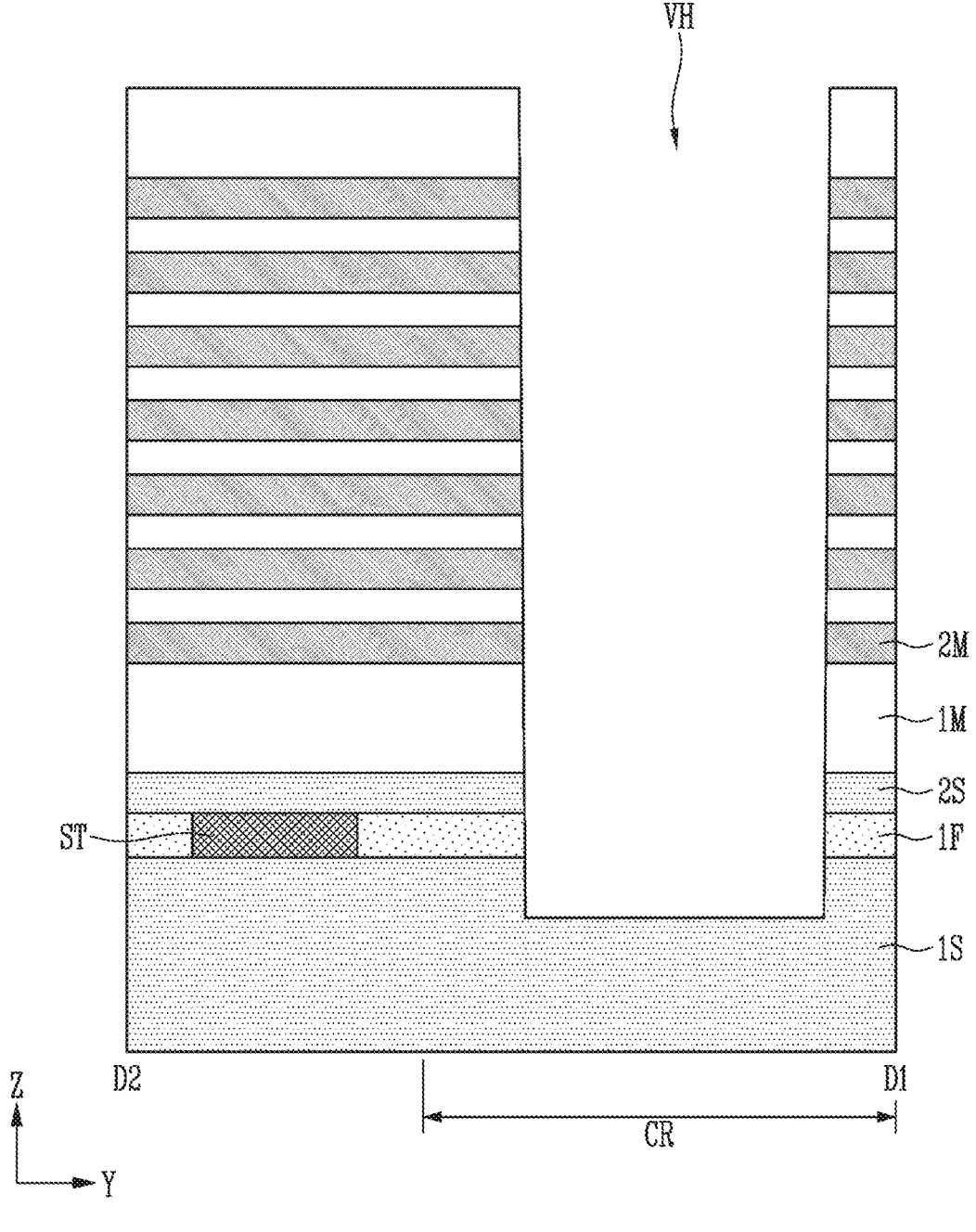
Figure 11D:
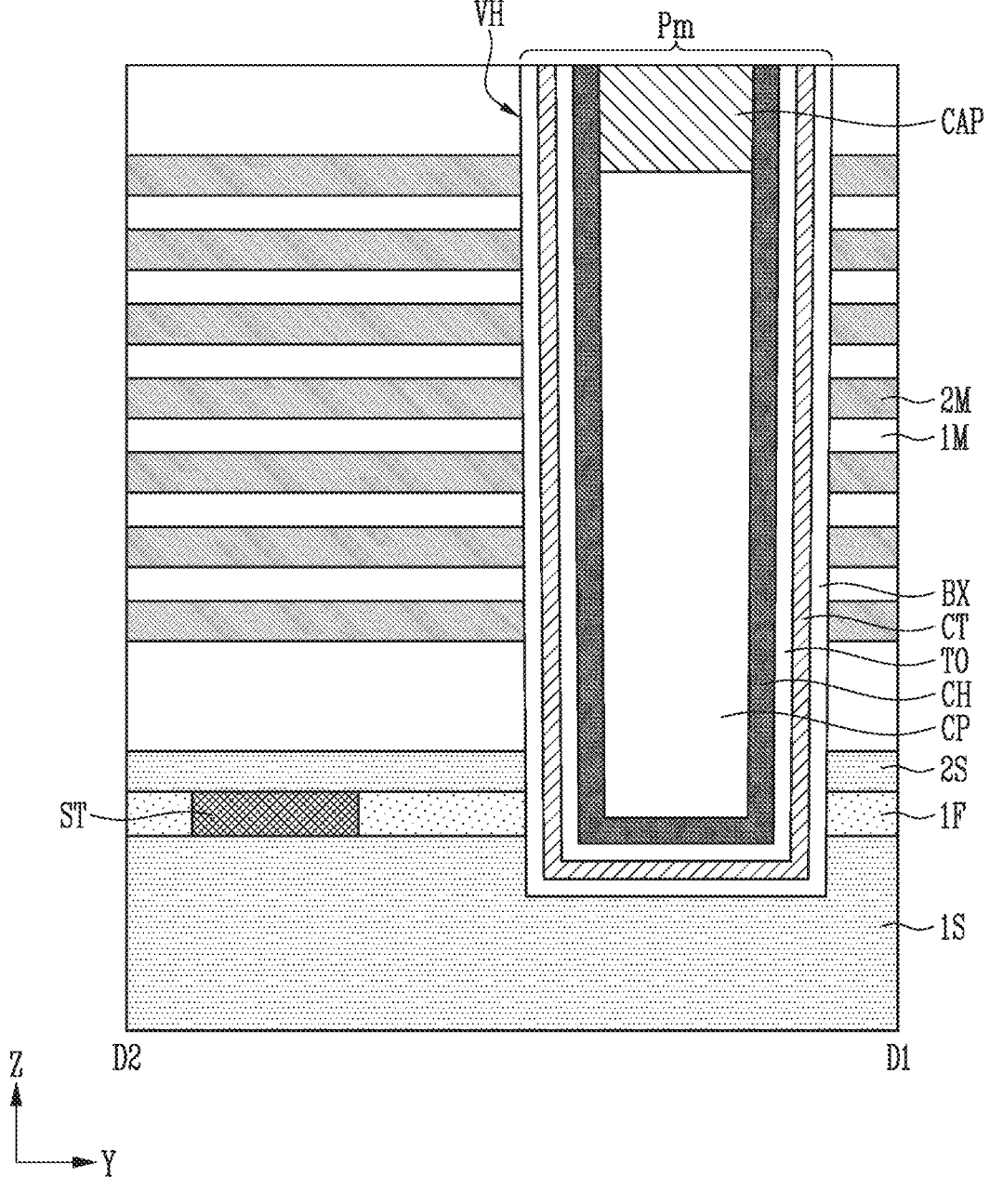
Figure 11E:
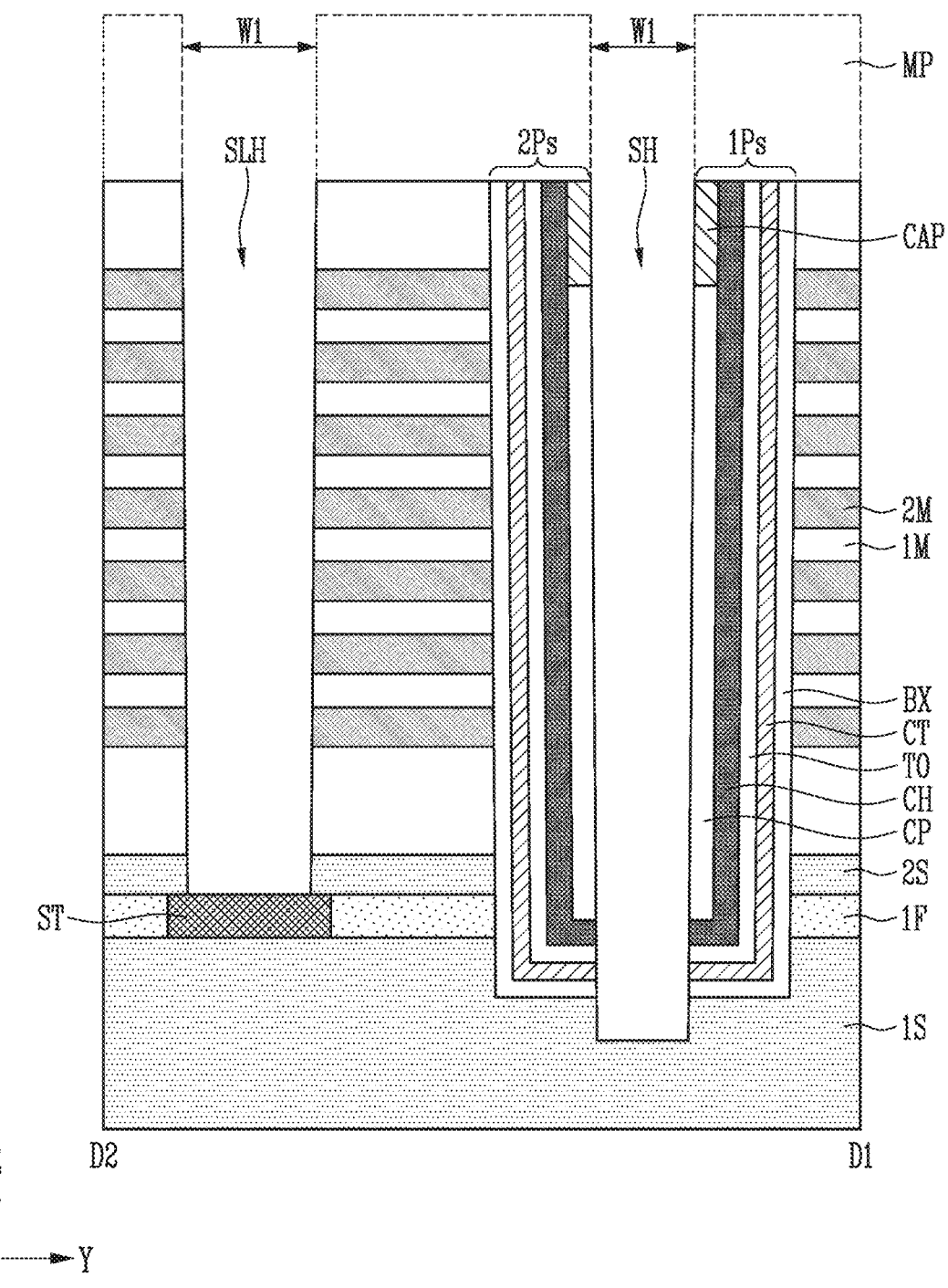
Figure 11F:
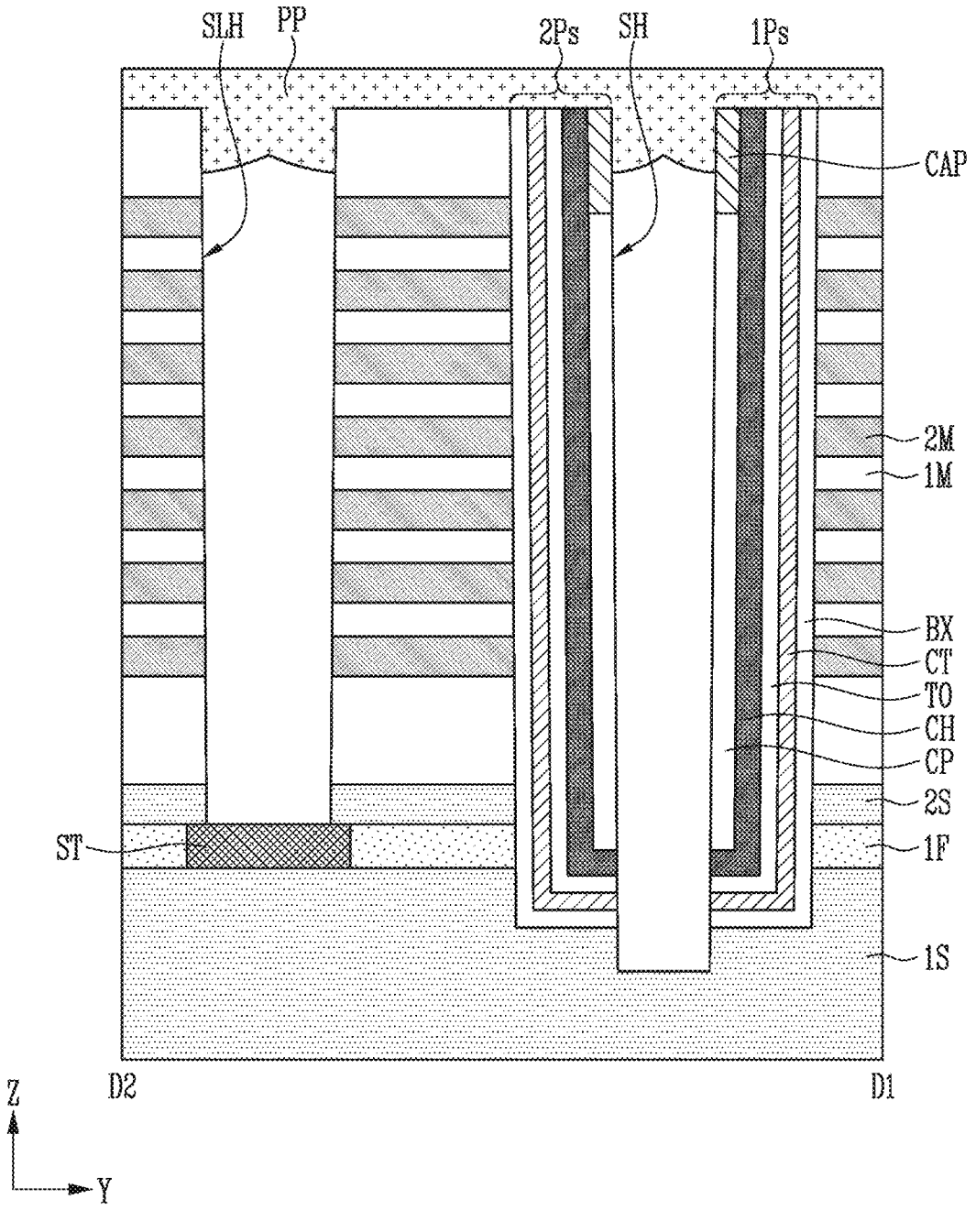
Figure 11G:
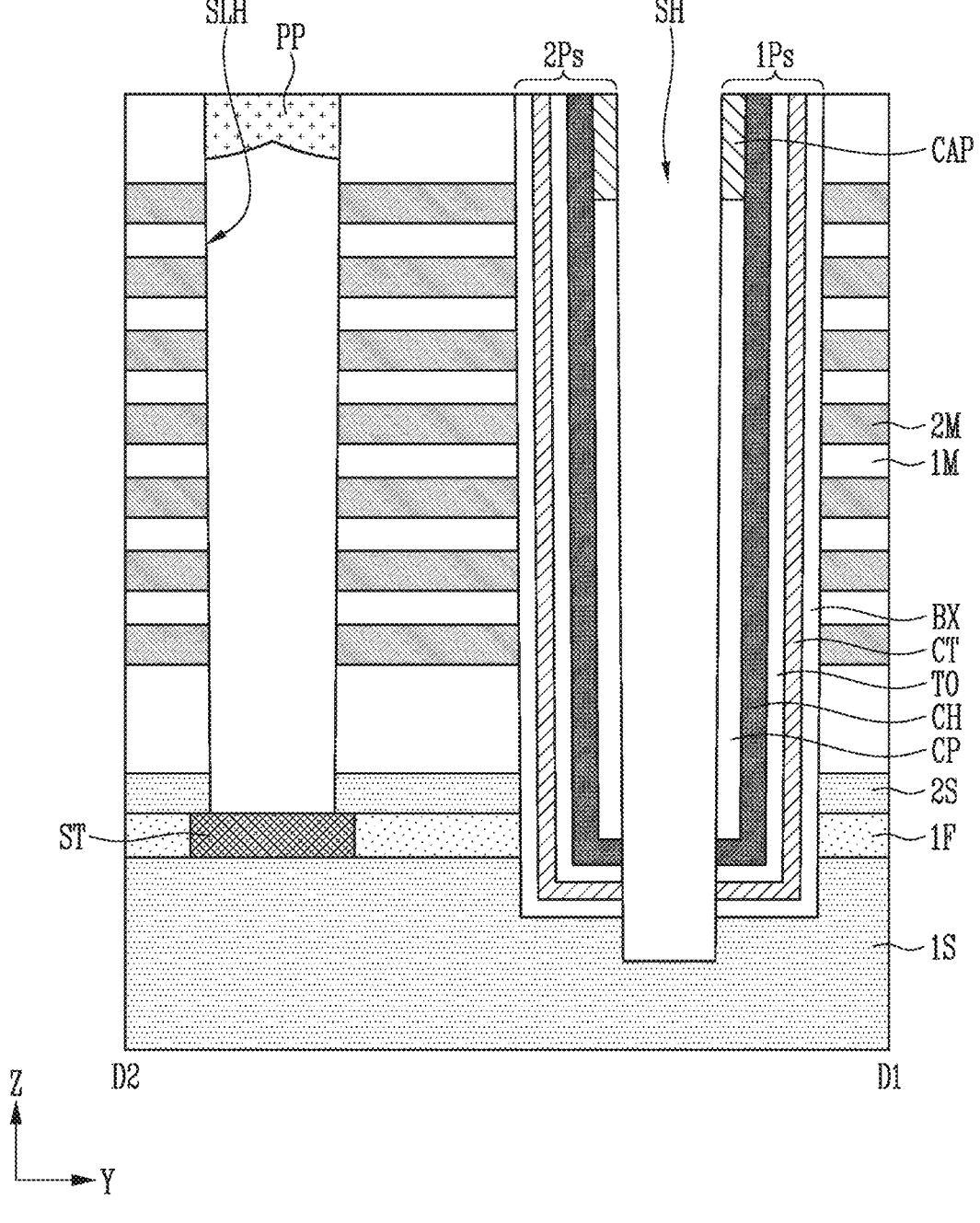
Figure 11H:
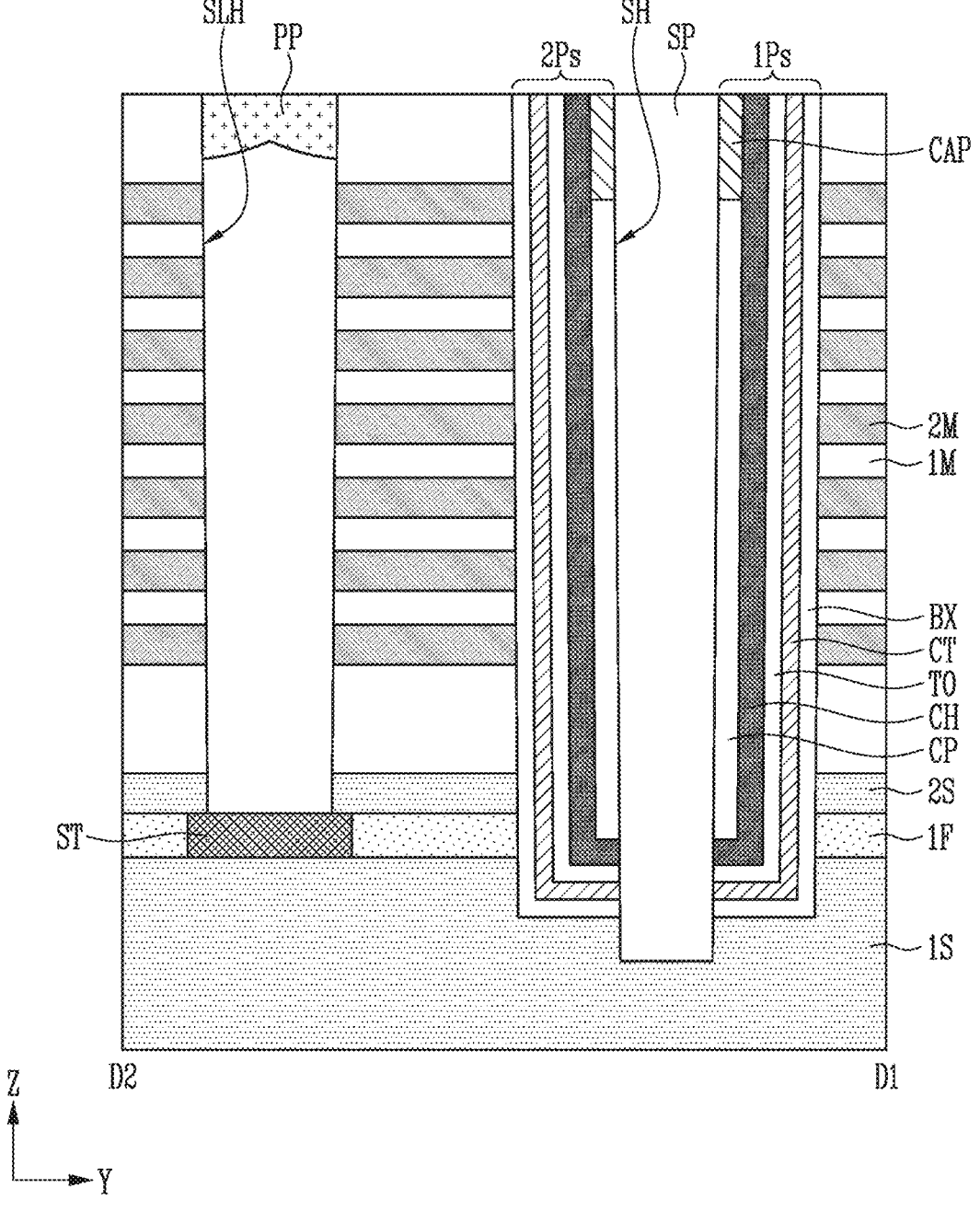
Figure 11I:
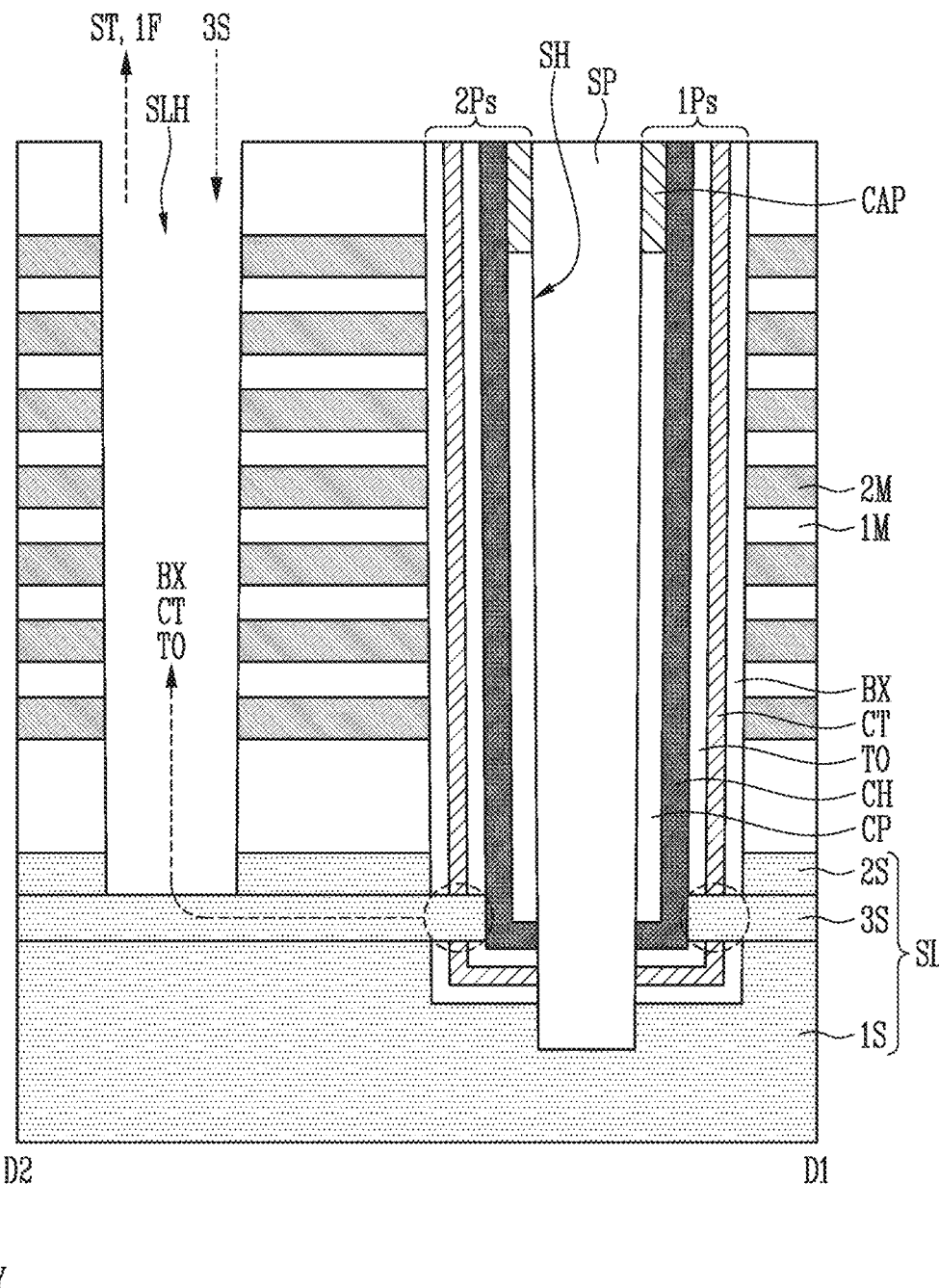
Figure 11J:
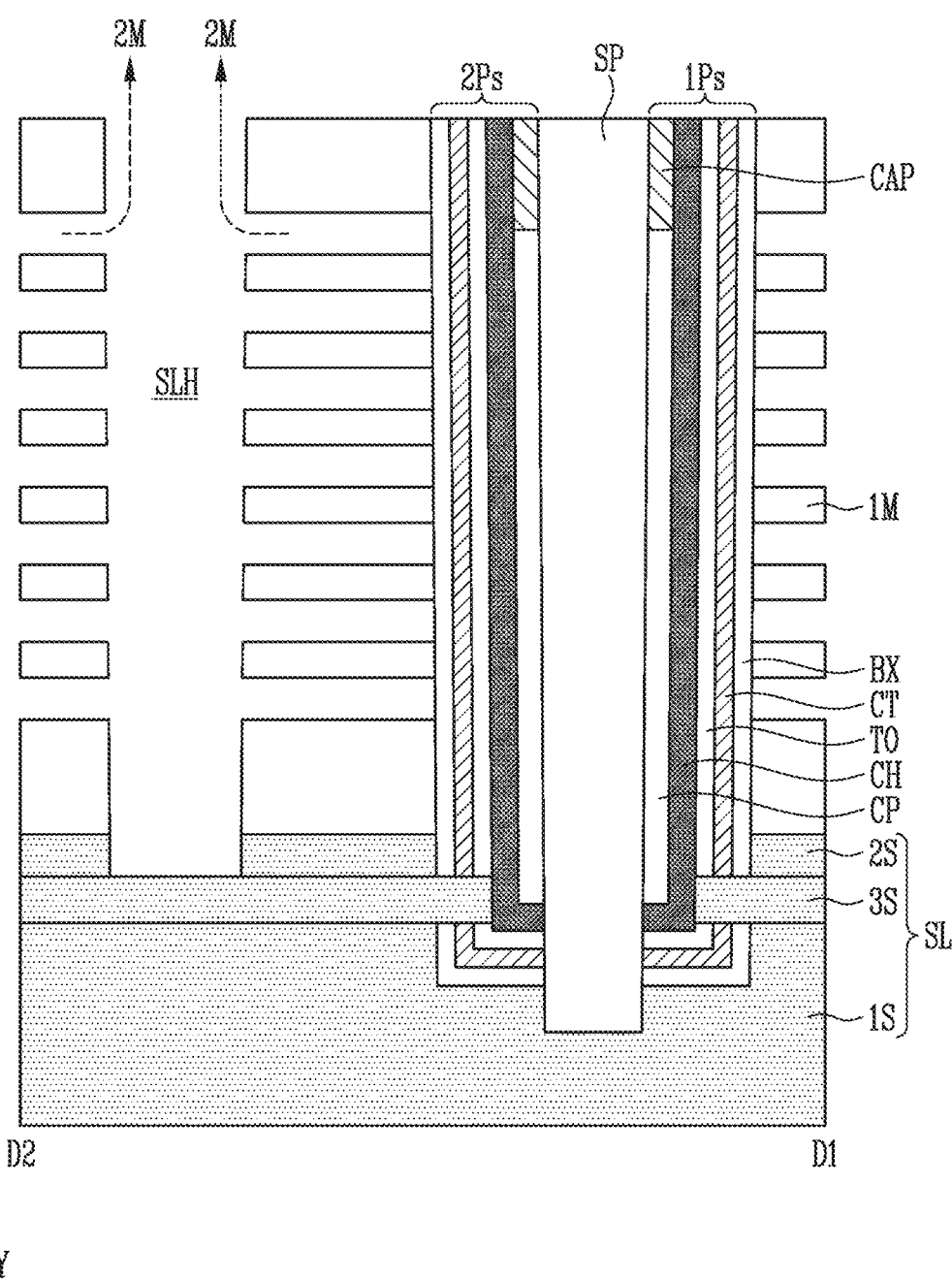
Figure 11K:
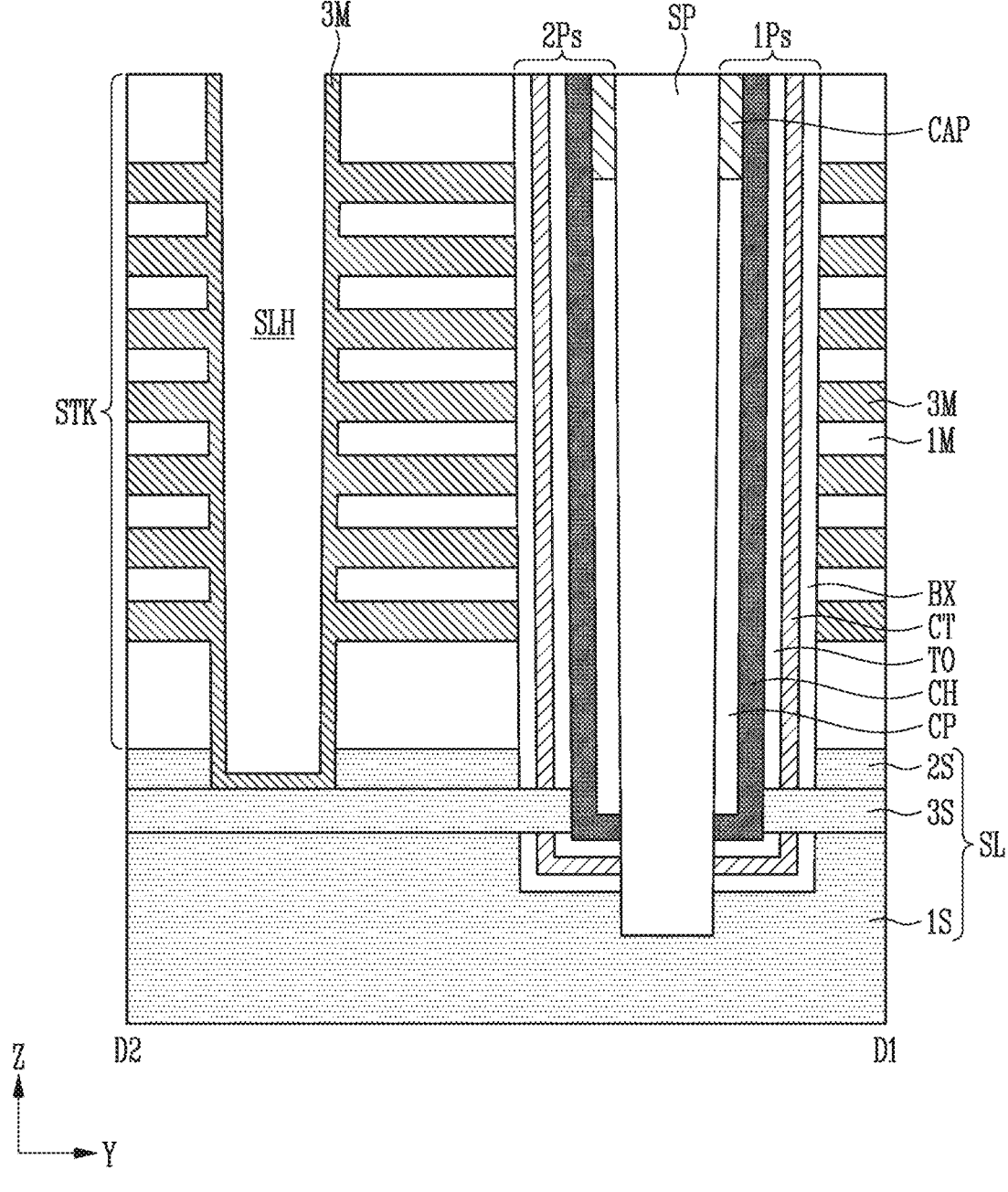
Figure 11L:
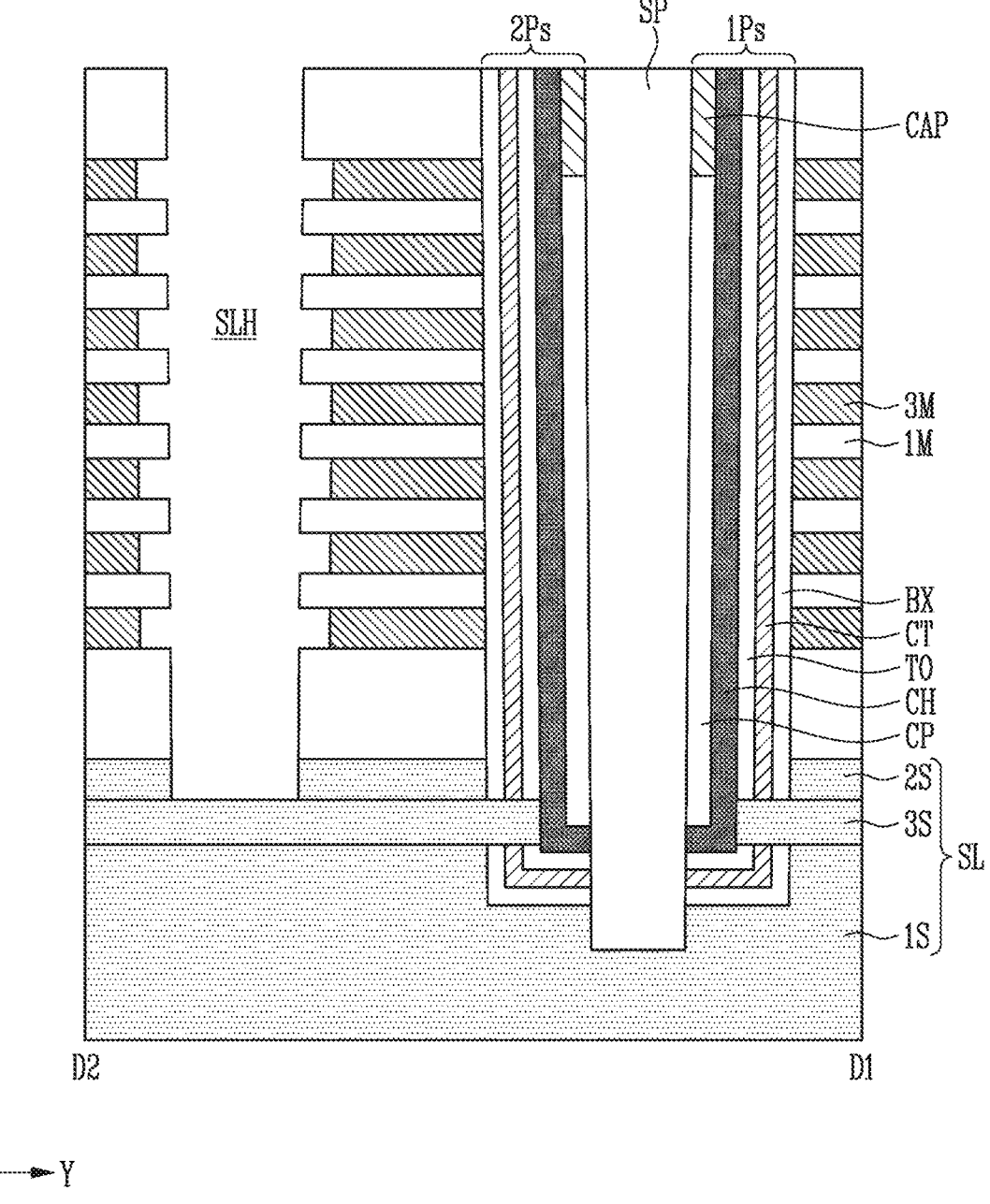
Figure 11M:
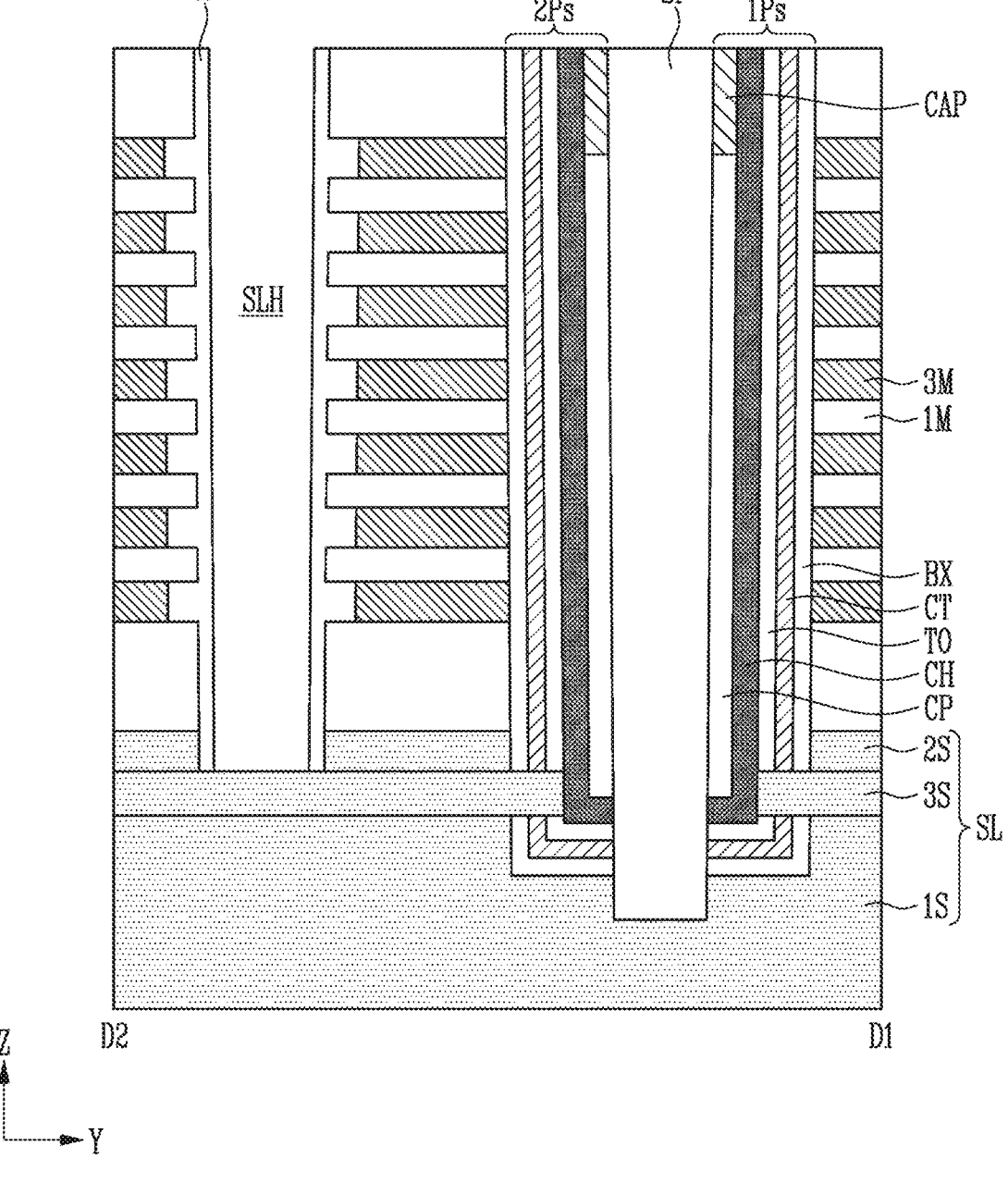
Figure 11N:
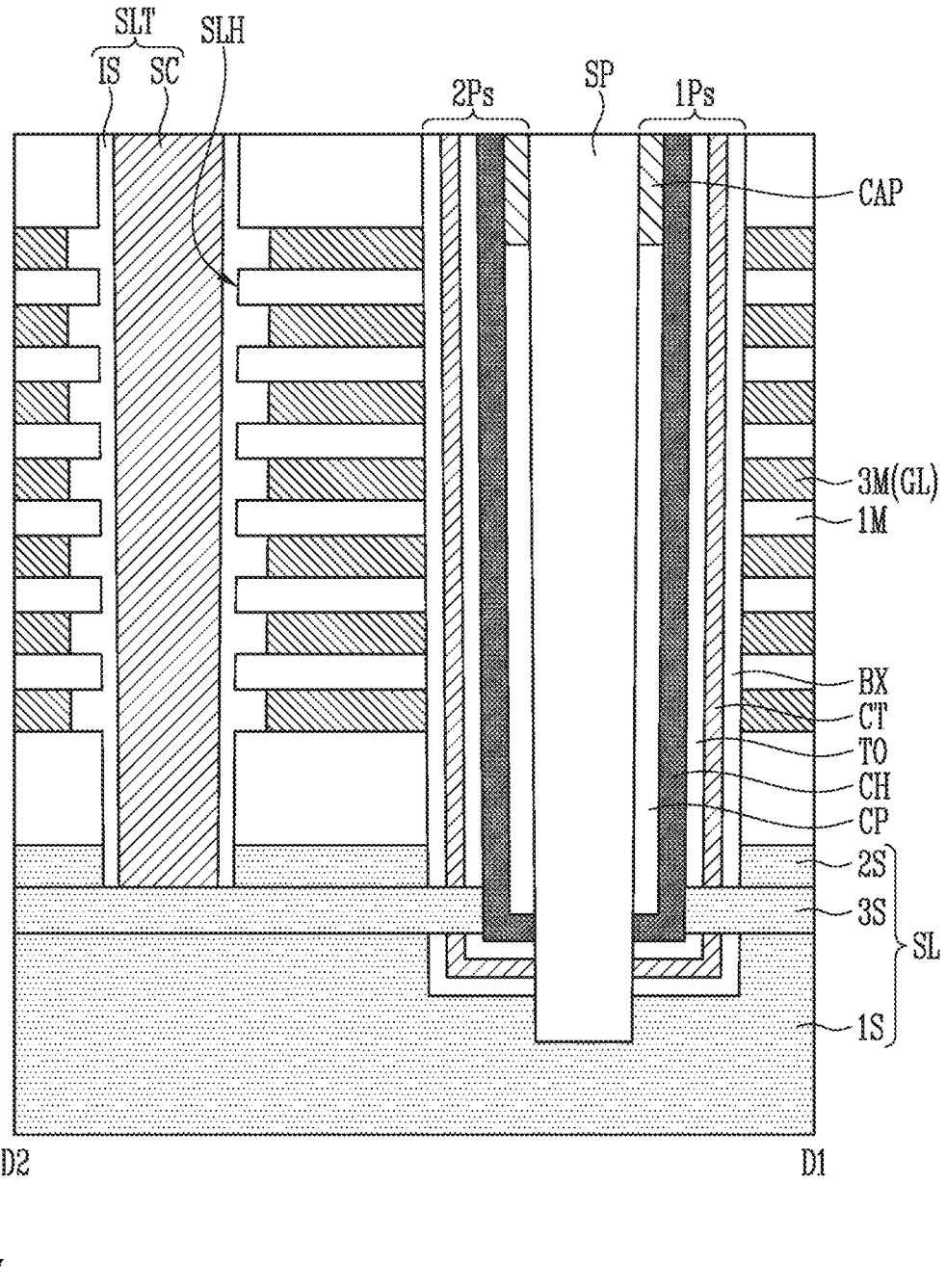

FIGS. 10A to 10N are layouts illustrating a method of manufacturing a memory device according to an embodiment of the present disclosure, and FIGS. 11A to 11N are cross-sectional views illustrating a method of manufacturing a memory device according to an embodiment of the present disclosure.

FIGS. 11A to 11N show a cross-sectional structure of a cross-section D1-D2 of FIGS. 10A to 10N.

Referring to FIGS. 10A and 11A, a first source layer 1S and a first sacrificial layer 1F may be stacked on a lower structure (not shown). The lower structure (not shown) may be a structure including a substrate or peripheral circuits. Because the first source layer 1S is a layer used as a source line, the first source layer 1S may be formed of a conductive material. For example, the first source layer 1S may be formed of a conductive material such as polysilicon, tungsten, or nickel. The first sacrificial layer 1F may be formed of a material having an etch selectivity with respect to the first source layer 1S. An etch stop layer ST may be formed for a portion of the first sacrificial layer 1F. The etch stop layer ST may be a stop layer for preventing over-etching during an etching process for forming a slit hole in the slit area. The etch stop layer ST may be formed of a conductive material such as tungsten. When the (n−1)-th and n-th memory blocks BLK(n−1) and BLKn are arranged to be spaced apart from each other in the Y direction, the etch stop layer ST may be formed to extend in the X direction in a boundary area BR between the (n−1)-th and n-th memory blocks BLK(n−1) and BLKn.

Referring to FIGS. 10B and 11B, a second source layer 2S may be formed on the first sacrificial layer 1F and the etch stop layer ST. The second source layer 2S may be formed of the same material as the first source layer 1S. Although not shown in the drawing, in order to protect the first and second source layers 1S and 2S in a subsequent process, a buffer layer may be further formed between the first source layer 1S and the first sacrificial layer 1F, and between the second source layer 2S and the first sacrificial layer 1F. For example, the buffer layer may be formed of an oxide layer. Subsequently, first and second material layers 1M and 2M may be alternately stacked on the second source layer 2S. For example, when the first material layer 1M is formed on the second source layer 2S, the second material layer 2M may be formed on the first material layer 1M, and the first material layer 1M may be formed again on the second material layer 2M. The first material layer 1M may be formed of an insulating material. For example, the first material layer 1M may be formed of an oxide layer or a silicon oxide layer. The second material layer 2M may be formed of a material that may be selectively removed in a subsequent process. Therefore, the second material layer 2M may be formed of a material having an etch selectivity different from that of the first material layer 1M. For example, the second material layer 2M may be formed of a nitride layer. In a structure in which the first and second material layers 1M and 2M are stacked, the first material layer 1M may be formed at the lowermost and the uppermost positions.

Referring to FIGS. 10C and 11C, a vertical hole VH exposing the first source layer 1S may be formed in a cell area CR of the (n−1)-th and n-th memory blocks BLK(n−1) and BLKn. For example, an etching process for removing a portion of the first and second material layers 1M and 2M, and an etching process for removing a portion of the second source layer 2S, the first sacrificial layer 1F, and a portion of the first source layer 1S may be performed. The etching process may be performed as a dry etching process so that the vertical hole VH is formed in a direction perpendicular to the substrate. The vertical hole VH may be formed in an area for forming the main plug. A long axis of the vertical hole VH becomes the Y direction, and a short axis becomes the x direction. When the etching process for forming the vertical hole VH is finished, the first source layer 1S may be exposed through a lower surface of the vertical hole VH, and the first and second material layers 1M and 2M may be exposed through a side surface of the vertical hole VH.

Referring to FIGS. 10D and 11D, the main plug Pm may be formed inside the vertical hole VH. The main plug Pm may include a blocking layer BX, a charge trap layer CT, a tunnel insulating layer TO, a channel layer CH, a core pillar CP, and a capping layer CAP. For example, the blocking layer BX may be formed along an inner surface of the vertical hole VH. Because the blocking layer BX is not filled inside of the vertical hole VH, the blocking layer BX may be formed in a hollow cylindrical or tubular shape. Subsequently, the charge trap layer CT may be formed along an inner surface of the blocking layer BX, and the tunnel insulating layer TO may be formed along an inner surface of the charge trap layer CT. The channel layer CH may be formed along an inner surface of the tunnel insulating layer TO, and the core pillar CP may be filled inside surrounded by the channel layer CH. After the core pillar CP is formed, an etching process for removing a portion of an upper area of the core pillar CP may be performed, and the capping layer CAP may be formed in an area where the core pillar CP is removed.

Referring to FIGS. 10E and 11E, a separation hole SH for separating the main plug Pm in the Y direction may be formed. At this time, a slit hole SLH having the same pattern as the separation hole SH may be simultaneously formed in the boundary area BR. For example, in order to simultaneously remove the main plug Pm and a portion of the first and second material layers 1M and 2M of the boundary area BR, a mask pattern MP in which openings are formed in the boundary area BR and the cell area may be formed on the entire structure, and an etching process of etching a portion exposed through the opening of the mask pattern MP may be performed. All widths of the openings of the mask pattern MP may have the first width W1. By the etching process, the separation hole SH may be formed in the cell area, and the slit hole SLH may be formed in the boundary area BR. The etching process for forming the separation hole SH and the slit hole SLH may be performed until the first source layer 1S of the cell area is exposed so that the channel layer CH included in the main plug Pm may be separated. At this time, because the first source layer 1S is not exposed by the etch stop layer ST in the boundary area BR, a depth of the slit hole SLH may be formed to be shallower than that of the separation hole SH. The main plug Pm may be separated into the first sub-plug 1Ps and the second sub-plug 2Ps by the separation hole SH. When the etching process is ended, the mask pattern MP is removed.

Referring to FIGS. 10F and 11F, a blocking pattern PP may be formed on the entire structure. The blocking pattern PP may be formed of a material with high step coverage so that an upper portion of the slit hole SLH and the separation hole SH are covered before an inside of the slit hole SLH and the separation hole SH is filled. The blocking pattern PP may be formed of an oxide layer for which the step coverage is higher than that of the first material layer 1M. Because a deposition speed of a material for which step coverage is high is faster than that of a general material, upper openings of the slit hole SLH and the separation hole SH may be covered over without being filled.

Referring to FIGS. 10G and 11G, an etching process for causing the blocking pattern PP formed in an upper portion of the slit hole SLH to remain and for removing the blocking pattern PP formed in a remaining area may be performed. For example, a planarization process may be performed until the first material layer 1M or the capping layer CAP is exposed. When the planarization process is performed, the blocking pattern PP formed on the first material layer 1M and the first and second sub-plugs 1Ps and 2Ps may be removed, and the blocking patterns PP formed in the slit hole SLH and the separation hole SH may remain. Subsequently, an etching pattern exposing the cell area on the boundary area BR may be formed, and an etching process for removing the blocking pattern PP exposed through an opening of the etch pattern may be performed. Accordingly, the blocking pattern PP may remain on the upper portion of the slit hole SLH, and the blocking pattern PP formed in the separation hole SH may be removed. Therefore, the first source layer 1S is exposed through the separation hole SH, and the slit hole SLH is not exposed by the blocking pattern PP.

Referring to FIGS. 10H and 11H, the separation pattern SP may be formed inside the separation hole SH exposing the first source layer 1S. The separation pattern SP may be formed of an insulating material so that the channel layers CH of the first and second sub-plugs 1Ps and 2Ps are electrically disconnected from each other. For example, the separation pattern SP may be formed of an insulating material for which step coverage is lower than that of the blocking pattern PP. For example, the separation pattern SP may be formed of an oxide layer or a silicon oxide layer. Because the slit hole SLH is not exposed by the blocking pattern PP, the separation pattern SP is not formed inside the slit hole SLH when a process of filling the separation pattern SP inside the separation hole SH is performed.

Referring to FIGS. 10I and 11I, an etching process for removing the blocking pattern PP formed on the upper portion of the slit hole SLH may be performed. When all blocking patterns PP are removed, because the etch stop layer ST is exposed through the slit hole SLH, an etching process for selectively removing the etch stop layer ST may be performed. Because the first sacrificial layer 1F is exposed through the slit hole SLH when the etch stop layer ST is removed, an etching process for removing the first sacrificial layer 1F may be performed.

Because a lower area of the first and second sub-plugs 1Ps and 2Ps is partially exposed through the slit hole SLH when the first sacrificial layer 1F is removed, an etching process for removing the blocking layer BX, the charge trap layer CT, and the tunnel insulating layer TO of the first and second sub-plugs 1Ps and 2Ps may be performed. In a cross-section of a D1-D2 direction, the first sub-plug 1Ps is not exposed through the slit hole SLH. However, referring to an X-Y plane, a portion of the first sub-plug 1Ps is exposed through an area where the first sacrificial layer 1F is removed. Therefore, the blocking layer BX, the charge trap layer CT, and the tunnel insulating layer TO of the first sub-plug 1Ps may be removed through the area where the first sacrificial layer 1F is removed and the slit hole SLH. The etching process for removing the blocking layer BX, the charge trap layer CT, and the tunnel insulating layer TO may be performed until the channel layer CH is exposed. Subsequently, a third source layer 3S may be formed in the area where the first sacrificial layer 1F is removed. The third source layer 3S may be formed of the same material as the first or second source layer 1S or 2S. Accordingly, the source line SL configured of the first to third source layers 1S to 3S may be formed.

Referring to FIGS. 10J and 11J, an etching process for removing the second material layer 2M exposed through the slit hole SLH may be performed. The etching process may be performed as a wet etching process using an etchant for causing the first material layer 1M to remain and selectively removing the second material layer 2M.

Referring to FIGS. 10K and 11K, a deposition process for filling a third material layer 3M in an area where the second material layer 2M is removed may be performed. Because the third material layer 3M formed between the first material layers 1M is used as a gate line, the third material layer 3M may be formed of a conductive material. For example, the third material layer 3M may be formed of at least one of tungsten (W), cobalt (Co), nickel (Ni), molybdenum (Mo), silicon (Si), and polysilicon (poly-Si). When the third material layer 3M is formed between the first material layers 1M, a stack structure STK including the first and third material layers 1M and 3M may be formed. When the third material layer 3M is formed between the first material layers 1M, the third material layer 3M may also be formed on a surface of the slit hole SLH.

Referring to FIGS. 10L and 11L, an etching process for removing the third material layer 3M formed along the surface of the slit hole SLH may be performed. The etching process is performed to remove the third material layer 3M formed on the surface of the slit hole SLH, but a portion adjacent to the slit hole SLH may also be removed together among the third material layers 3M formed between the first material layers 1M.

Referring to FIGS. 10M and 11M, the insulating layer IS may be formed along the surface of the slit hole SLH. The insulating layer IS may be formed of an oxide layer or a silicon oxide layer. The insulating layer IS may be formed to cover all of the third material layer 3M exposed through a side surface of the slit hole SLH. Because the insulating layer IS may be formed under the slit hole SLH, an etching process for exposing the third source layer 3S through a lower surface of the slit hole SLH may be performed after the insulating layer IS is formed. The etching process may be performed as a dry etching process to maintain the insulating layer IS formed on the side surface of the slit hole SLH and selectively remove the insulating layer IS formed on the lower surface of the slit hole SLH.

Referring to FIGS. 10N and 11N, a deposition process for forming the source contact SC in the slit hole SLH may be performed. The source contact SC may be formed of a conductive material. For example, the source contact SC may be formed of doped poly-silicon or tungsten. Because the insulating layer IS is formed between the third material layer 3M for the gate line GL and the source contact SC, the gate lines GL included in each of the (n–1)-th and n-th memory blocks BLK(n–1) and BLKn divided by the slit SLT may also be separated from each other.

Figure 12:
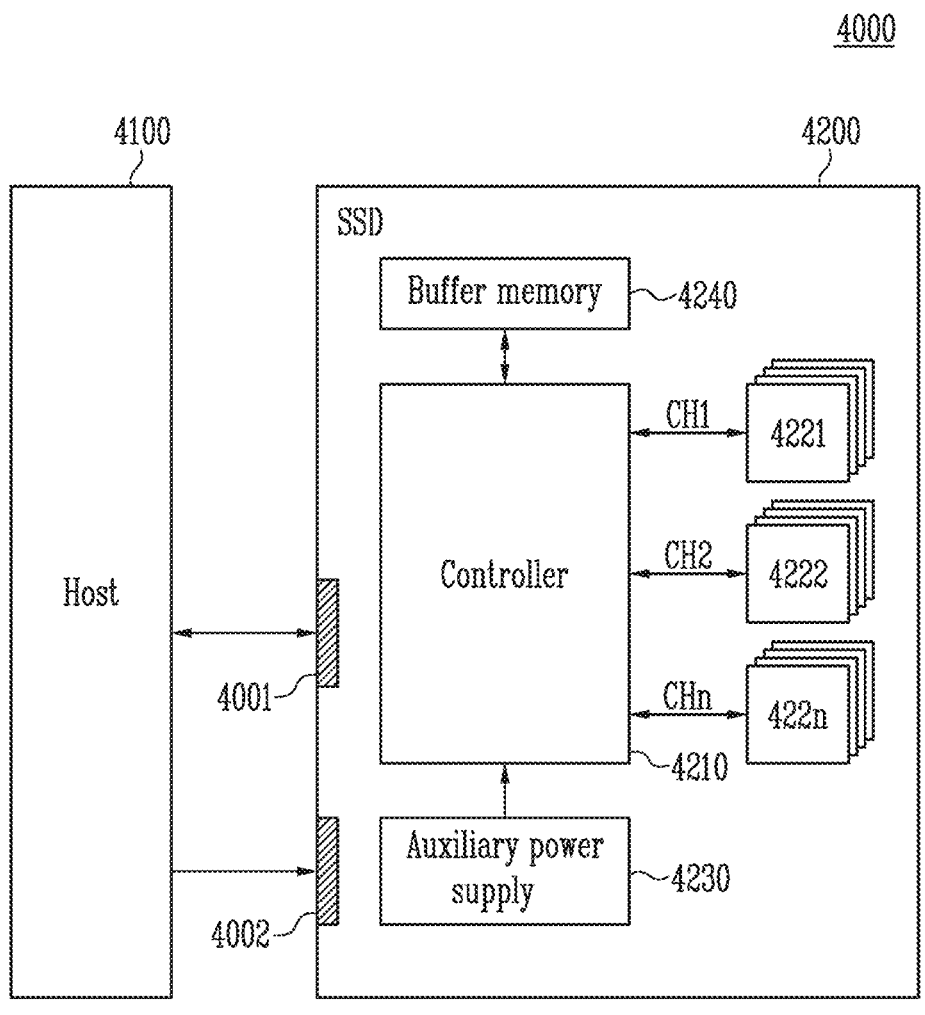
FIG. 12 is a diagram illustrating a solid state drive (SSD) system to which a memory device of the present disclosure is applied.

FIG. 12 is a diagram illustrating a solid state drive (SSD) system 4000 to which a memory device of the present disclosure is applied.

Referring to FIG. 12, the SSD system 4000 includes a host 4100 and an SSD 4200. The SSD 4200 exchanges signals with the host 4100 through a signal connector 4001 and receives power through a power connector 4002. The SSD 4200 includes a controller 4210, a plurality of memory devices 4221 to 422*n*, an auxiliary power supply 4230, and buffer memory 4240.

The controller 4210 may control the plurality of memory devices 4221 to 422*n* in response to the signals received from the host 4100. For example, the signals may be transmitted based on an interface between the host 4100 and the SSD 4200. For example, the signals may be defined by at least one of interfaces such as a universal serial bus (USB), a multimedia card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe.

The plurality of memory devices 4221 to 422*n* may include a plurality of memory cells configured to store data. Each of the plurality of memory devices 4221 to 422*n* may be configured identically to the memory device 100 shown in FIG. 1. The plurality of memory devices 4221 to 422*n* may communicate with the controller 4210 through channels CH1 to CHn.

The auxiliary power supply 4230 is connected to the host 4100 through the power connector 4002. The auxiliary power supply 4230 may receive a power voltage from the host 4100 and charge the power voltage. The auxiliary power supply 4230 may provide the power voltage of the SSD 4200 when power supply from the host 4100 is not smooth. For example, the auxiliary power supply 4230 may be positioned in the SSD 4200 or may be positioned outside the SSD 4200. For example, the auxiliary power supply 4230 may be positioned on a main board and may provide auxiliary power to the SSD 4200.

The buffer memory 4240 operates as buffer memory of the SSD 4200. For example, the buffer memory 4240 may temporarily store data received from the host 4100 or data received from the plurality of memory devices 4221 to 422*n*, or may temporarily store metadata (for example, a mapping table) of the memory devices 4221 to 422*n*. The buffer memory 4240 may include volatile memory such as DRAM, SDRAM, DDR SDRAM, or LPDDR SDRAM; or the buffer memory 4240 may include nonvolatile memory such as FRAM, ReRAM, STT-MRAM, or PRAM.

Figure 13:
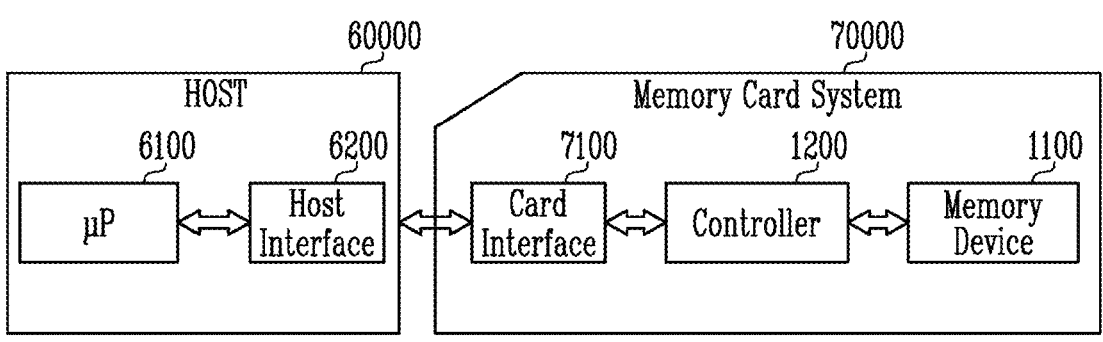
FIG. 13 is a diagram illustrating a memory card system to which a memory device of the present disclosure is applied.

FIG. 13 is a diagram illustrating a memory card system 70000 to which a memory device of the present disclosure is applied.

Referring to FIG. 13, the memory card system 70000 may be implemented as a memory card or a smart card. The memory card system 70000 may include a memory device 1100, a controller 1200, and a card interface 7100.

The memory device 1100 may be configured identically to the memory device 100 shown in FIG. 1.

The controller 1200 may control data exchange between the memory device 1100 and the card interface 7100. According to an embodiment, the card interface 7100 may be a secure digital (SD) card interface or a multi-media card (MMC) interface, but is not limited thereto.

The card interface 7100 may interface data exchange between a host 60000 and the controller 1200 according to a protocol of the host 60000. According to an embodiment, the card interface 7100 may support a universal serial bus (USB) protocol, and an inter chip (IC)-USB protocol. Here, the card interface 7100 may refer to hardware capable of supporting a protocol that is used by the host 60000, software installed in the hardware, or a signal transmission method.

When the memory card system 70000 is connected to a host interface 6200 of the host 60000 such as a PC, a tablet PC, a digital camera, a digital audio player, a mobile phone, a console video game hardware, or a digital set-top box, the host interface 6200 may perform data communication with the memory device 1100 through the card interface 7100 and the controller 1200 under control of a microprocessor (μP) 6100.

What is claimed is:

1. A memory device comprising:
a stack structure;
main plugs passing through the stack structure and arranged to be spaced apart from each other in a first direction;
a separation pattern separating the main plugs in a second direction; and
a slit pattern separating the stack structure into first and second memory blocks, the slit pattern having an elliptical shape,

wherein a width of the slit pattern is substantially the same as a width of the separation pattern.

2. The memory device of claim 1, wherein each of the main plugs includes first and second sub-plugs separated from each other by the separation pattern.

3. The memory device of claim 2, wherein the first and second sub-plugs have a structure symmetrical to each other across the separation pattern.

4. The memory device of claim 3, wherein each of the first and second sub-plugs includes a core pillar, a channel layer, a tunnel insulating layer, a charge trap layer, and a blocking layer passing through the stack structure.

5. The memory device of claim 1, wherein the slit pattern comprises:
a source contact; and
an insulating layer surrounding a side surface of the source contact.

6. The memory device of claim 5, wherein the insulating layer is formed between gate lines included in the stack structure and the source contact.

7. The memory device of claim 1, wherein the separation pattern has the ellipse shape.

8. The memory device of claim 1, wherein a length of the slit pattern is the same as a length of the separation pattern.

9. The memory device of claim 1, wherein the stack structure includes gate lines stacked to be spaced apart from each other in a vertical direction.

10. A memory device comprising:
a stack structure disposed over a source line;
main plugs passing through the stack structure and arranged to be spaced apart from each other in a first direction;
separation patterns separating the main plugs in a second direction; and
a slit separating the stack structure into first and second memory blocks, the slit comprising slit patterns having an elliptical shape,
wherein a width of at least one of the slit patterns is substantially the same as a width of at least one of the separation patterns.

11. The memory device of claim 10, wherein the slit patterns are arranged to be spaced apart from each other in the first direction.

12. The memory device of claim 10, wherein the slit patterns are connected to each other through connection structures.

13. The memory device of claim 12, wherein the connection structures are arranged in a ladder shape between the slit patterns.

14. The memory device of claim 12, wherein the slit patterns comprise:
source contacts formed on the source line in a direction substantially normal to a plane defined by the first and second directions; and
insulating layers surrounding the source contacts.

15. The memory device of claim 14, wherein the connection structures comprise:
conductive patterns connecting the source contacts to each other between the slit patterns adjacent to each other; and
insulating patterns surrounding the conductive patterns.

* * * * *